United States Patent
Zhang et al.

(10) Patent No.: US 11,321,050 B1
(45) Date of Patent: May 3, 2022

(54) METHOD AND SYSTEM FOR ANALOG COMPUTING WITH SUB-BINARY RADIX WEIGHT REPRESENTATION

(71) Applicant: Aistartek HK limited, Hong Kong (CN)

(72) Inventors: Zhongxuan Zhang, San Diego, CA (US); Yucong Gu, San Jose, CA (US)

(*) Notice: Subject to any disclaimer, the term of this patent is extended or adjusted under 35 U.S.C. 154(b) by 0 days.

(21) Appl. No.: 17/564,097

(22) Filed: Dec. 28, 2021

(51) Int. Cl.
*G06F 7/523* (2006.01)
*G06N 3/063* (2006.01)
*G11C 11/412* (2006.01)
*H03M 1/12* (2006.01)

(52) U.S. Cl.
CPC .......... *G06F 7/523* (2013.01); *G06N 3/0635* (2013.01); *G11C 11/412* (2013.01); *H03M 1/12* (2013.01)

(58) Field of Classification Search
CPC ...... G06N 3/0635; G11C 11/412; H03M 1/12
USPC ....................................................... 708/835
See application file for complete search history.

(56) References Cited

U.S. PATENT DOCUMENTS

| | | | |
|---|---|---|---|
| 9,910,827 B2* | 3/2018 | Muralimanohar | H03M 1/12 |
| 10,496,855 B2* | 12/2019 | Muralimanohar | G06G 7/14 |
| 2017/0040054 A1* | 2/2017 | Friedman | G11C 7/16 |
| 2019/0034201 A1* | 1/2019 | Muralimanohar | G06F 9/30036 |
| 2020/0327287 A1* | 10/2020 | Piveteau | G11C 13/0007 |
| 2020/0380349 A1* | 12/2020 | Rasch | G06N 3/04 |
| 2021/0271732 A1* | 9/2021 | Ge | H03M 1/66 |

* cited by examiner

*Primary Examiner* — Tan V Mai

(57) ABSTRACT

A system for analog computing, an analog computing system with sub-binary radix weight representation is provided. The analog computing system comprises an input node, a multiplexer (MUX), a digital to analog converter (DAC), a SRAM-based Sub-Binary Multiplier (SSBM), an analog to digital converter (ADC), a switch, an output node and a calibration module. The calibration module is configured to control the analog computing system to switch between a calibration mode and a normal operation mode. Prior to being switched to the normal operation mode, the analog computing system is configured to perform a process to calibrate a weight parameter stored in the SSBM. The ADC comprises a plurality of multipliers associated with a plurality of sub-binary weight radixes. The weight parameter stored in the SSBM and the plurality of sub-binary weight radixes are configured to represent a plurality of weights for the analog computing system.

20 Claims, 11 Drawing Sheets

US 11,321,050 B1

METHOD AND SYSTEM FOR ANALOG COMPUTING WITH SUB-BINARY RADIX WEIGHT REPRESENTATION

TECHNICAL FIELD

The present disclosure relates to an analog computing system, and more specifically relates to one or more embodiments of analog computing systems with sub-binary radix weight representation.

BACKGROUND

Artificial Intelligence (AI) is widely used in different technologies, including automatic driving, social media marketing. Neural Network is commonly implemented in AI, including for example in a machine learning process. A neural network comprises one or more computing layers, such as including an input layer, one or more hidden layers and an output layer. The inputs of the neural network are multiplied by different weights and then added together from the input layer to the output layer, through one or more multiplication and addition processes. The one or more multiplication and addition processes repeat for numerous times to achieve outputs of the neural network. In some implementations, one or more digital circuits are implemented in the neural network. However, the one or more digital circuits are extremely power consuming, also a large amount of chip area is needed for the one or more digital circuits. Although some of the digital circuits can be reused by using different input signals in a sequence and storing corresponding output signals in a memory cell, this may result in a large amount of data transferring. The large amount of data storage and transferring slows down the machine learning process.

The one or more multiplication and addition processes can be achieved by one or more analog circuits with less power consumption and smaller chip areas than the one or more digital circuits. However, the variability of identically designed analog devices in the one or more analog circuits has long been a concern since it directly affects the output variation of the one or more analog circuits. For example, the output of two transistors, such as a first transistor and a second transistor, with identical design parameters, is substantially different based on the same input for each of the two transistors. This behavior is caused by device mismatch. Device mismatch is due to the stochastic nature of physical processes that are used to fabricate the devices. Device mismatch is commonly seen in transistors. In one example, the output of the first transistor is 0.6 v and the output of the second transistor is 1.2 v based on the same input of the first transistor and the second transistor of 1 v. Furthermore, the output variation of the one or more analog circuits is increased during one or more computing operations. For example, during the one or more multiplication and addition operations, the output variation of the one or more analog devices is added together and amplified, thus resulting in a larger variation of outputs after the one or more multiplication and addition processes. In one or more implementations, the smaller the dimensions of the one or more analog devices, the more device mismatch is introduced, resulting in more output variations. To mitigate the impact of device mismatch and minimize the output variation of the one or more analog circuits, the present disclosure describes a system to calibrate the one or more analog circuits with a sub-binary radix representation.

SUMMARY

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

Features of the subject technology are set forth in the appended claims. However, for purpose of explanation, several embodiments of the subject technology are set forth in the following figures.

DETAILED DESCRIPTION

Figure 1:
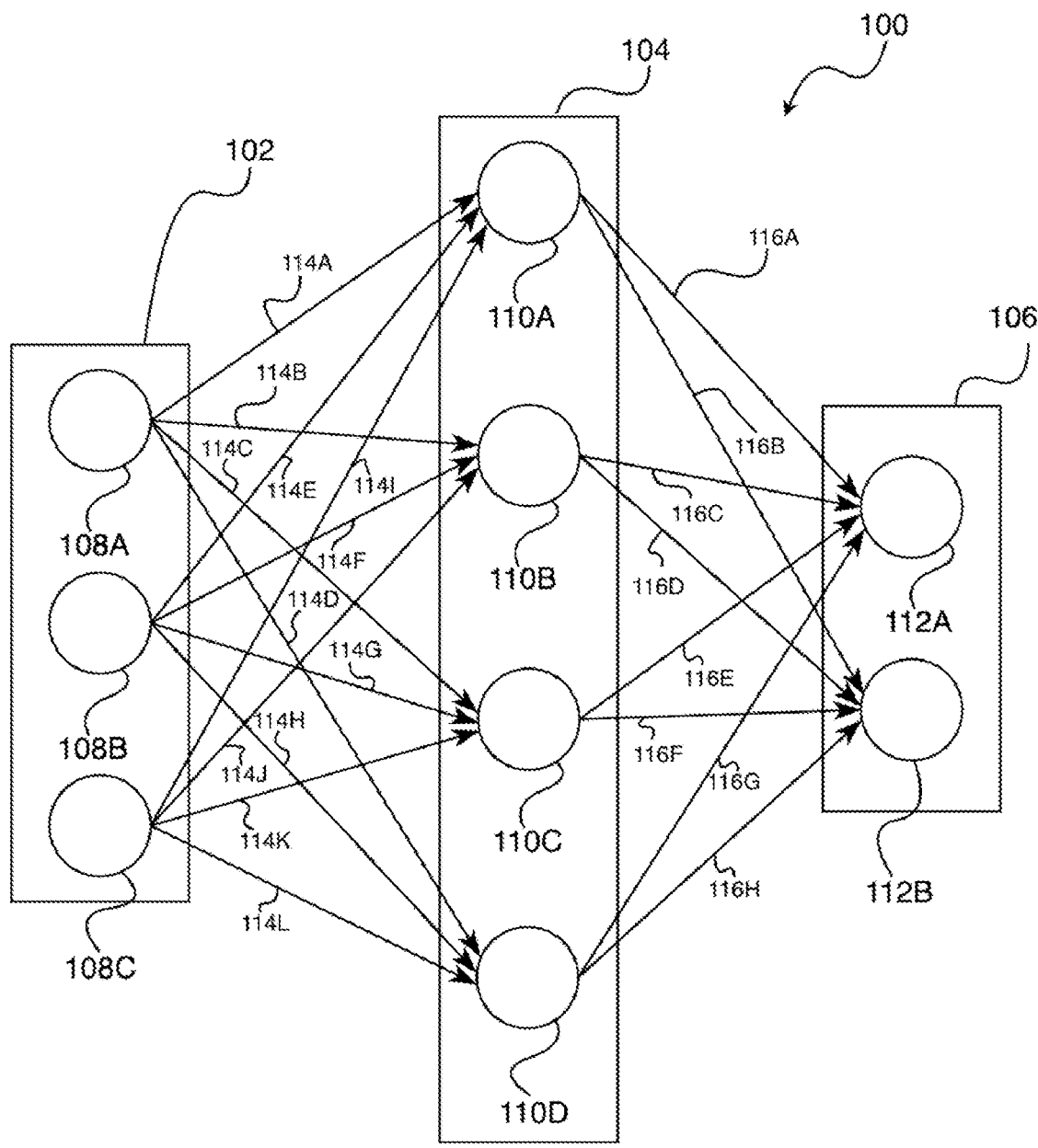
FIG. 1 illustrates an exemplary block diagram of a neural network environment 100.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without these specific details. In some instances, structures and components are shown in block diagram form in order to avoid obscuring the concepts of the subject technology.

It is to be understood that aspects of the present disclosure will be described in terms of a given illustrative architecture; however, other architectures, structures, materials and process features and steps can be varied within the scope of aspects of the present disclosure.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an analog computing system, which may include multiple features or combinations of features. Some or all features may or may not be present on the devices in accordance with embodiments of the present disclosure.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements and/or components, but do not preclude the presence or addition of one or more other features, integers, steps, operations, elements, components and/or groups thereof.

Spatially relative terms, such as "beneath", "below", "lower", "above", "upper", and the like, can be used herein for ease of description to describe one element's or feature's relationship to another element (s) or feature (s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present disclosure.

The system and methods of the present embodiments may also be employed on animals, models and other non-living substrates, such as, for example, in training, testing and demonstration.

It is to be understood that the present embodiments are not limited to the specific devices, methods, conditions or parameters described and/or shown herein, and that the terminology used herein is for the purpose of describing particular embodiments by way of example only and is not intended to be limiting. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about", it will be understood that the particular value forms another embodiment.

FIG. 1 illustrates an exemplary block diagram of a neural network environment 100 that may implement computing systems in accordance with one or more implementations. Not all of the depicted components may be used, however, and one or more implementations may include additional components not shown in the figure. Variations in the arrangement and types of the components may be made without departing from the spirit or scope of the claims as set forth herein. Additional, different or fewer components may be provided.

As illustrated in FIG. 1, neural network environment 100 includes an input layer 102 which includes one or more input nodes 108A-C, an intermediate layer 104 which includes one or more intermediate layer nodes 110A-D, an output layer 106 which includes one or more output nodes 112A-B, one or more input connections 114A-L and one or more output connections 116A-H. The one or more input nodes 108A-C in input layer 102 may be configured to receive one or more input signals. The one or more intermediate layer nodes 110A-D in intermediate layer 104 may be configured to receive signals from input layer 102 via the one or more input connection 114A-L. The one or more intermediate layer nodes 110A-D may be configured to store data and to perform computing operation such as addition of the signals received from input layer 102. The one or more output nodes 112A-B in the output layer 106 may be configured to receive and process signals from the middle layer 104 via the one or more output connection 116A-H, and to output one or more output signals. In some embodiments, the one or more input nodes 108A-C, the one or more intermediate layer nodes 110A-D and the one or more output nodes 112A-B may include one or more neurons.

The one or more input connections 114A-L may be configured to connect each of the one or more input nodes 108A-C with each of the one or more intermediate layer nodes 110A-D. The one or more input connections 114A-L may be configured to process one or more signals from the one or more input nodes 108A-C, such as multiplying the one or more signals with one or more input weights. After multiplication, the one or more input connections 114A-L may be configured to output the one or more signals to the one or more intermediate layer nodes 110A-D. For example, an input signal $X_1$ may be received by input node 108A. Then in the input connection 114A, the input signal $X_1$ may be multiplied by an input weight such as $W_{11}$; and a result of $X_1*W_{11}$ may be output by the input connection 114A to intermediate layer node 110A.

In some embodiments, each of the one or more intermediate layer nodes 110A-D may be configured to receive one or more signals from the one or more input connections 114A-L. Each of the one or more intermediate layer nodes 110A-D may be configured to perform an addition operation to the one or more signals received from the one or more input connections 114A-L. Each of the one or more intermediate layer nodes 110A-D may be configured to output the one or more signals after addition operation to the one or more output connections 116A-H.

The one or more output connections 116A-H may be configured to connect each of the one or more intermediate layer nodes 110A-D with each of the one or more output nodes 112A-B. The one or more output connections 116A-H may be configured to process one or more signals from the one or more intermediate layer nodes 110A-D, such as multiplying the one or more signals with one or more output weights, and output the one or more signals after multiplication to the one or more output nodes 112A-B.

In some embodiments, each of the one or more output nodes 112A-B may be configured to perform an addition operation to one or more signals received from the one or more output connections 116A-H, and then output the one or more signals after addition operation as the output of the neural network environment 100.

The one or more input weights and the one or more output weights may be programmable, therefore a programmable output may be then output from the neural network environment 100 based on the one or more input signals. For example, the input signal $X_1$ may be an image, and the one or more input weights and the one or more output weights can be programed to allow the neural network environment 100 to output a code corresponding to the content of the image.

Figure 2:
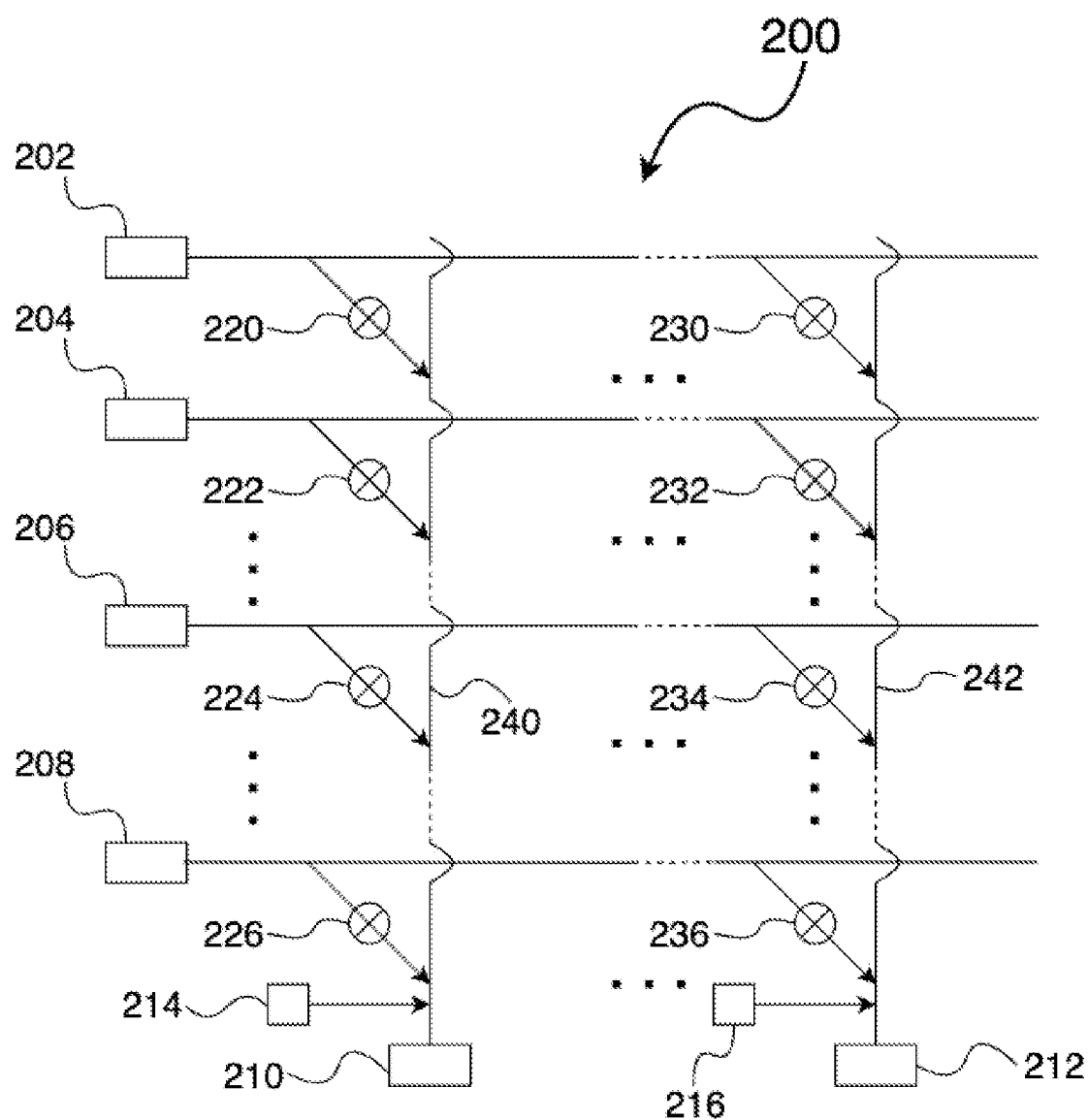
FIG. 2 illustrates an exemplary schematic diagram associated with the neural network environment 100 in FIG. 1.

FIG. 2 illustrates an exemplary schematic diagram associated with the neural network environment 100 in FIG. 1. A schematic diagram 200 illustrated in FIG. 2 may be associated with the neural network environment 100. The schematic diagram 200 includes one or more input nodes 202-208, one or more output nodes 210-212, one or more bias modules 214-216, one or more multipliers 220-236, and one or more output connections 240-242. In one example, the schematic diagram 200 may be associated with the input layer 102 and/or the intermediate layer 104 illustrated in FIG. 1. In another example, the schematic diagram 200 may be associated with the intermediate layer 104 and/or the output layer 106 illustrated in FIG. 1. The one or more multipliers 220-236 include a multiplier 220, a multiplier 222, a multiplier 224, a multiplier 226, a multiplier 230, a multiplier 232, a multiplier 234 and a multiplier 236, as illustrated in FIG. 2.

In some embodiments, each of the one or more input nodes 202-208 may be configured to receive an input signal. Each of the one or more input nodes 202-208 may include the input nodes 108A-C as illustrated in FIG. 1. Each of the one or more input nodes 202-208 may be configured to connect to the one or more multipliers 220-236. Each of the one or more input nodes 202-208 may be configured to output the input signal to the one or more multipliers 220-236. For example, the input node 202 may be configured to connect to the multiplier 220 and the multiplier 230 as illustrated in FIG. 2. The input node 202 may be configured to output the input signal to the one or more multipliers 220-236, such as the multiplier 220 and the multiplier 230 as illustrated in FIG. 2.

Each of the one or more multipliers 220-236 may be configured to store a weight, and to perform a multiplication of the weight with the input signal from one of the one or more input nodes 202-208. The one or more weights stored in the one or more multipliers 220-236 may include the one or more input weights and/or the one or more output weights described in FIG. 1. The output after multiplication after each of the one or more multipliers 220-236 may be sent to one of the one or more output connections 240-242. For example, the multiplier 220 may multiply the input signal from the input node 202 with the weight stored in the multiplier 220. The output after multiplication after multiplier 220 may be then output to the output connection 240. In some embodiments, the one or more multipliers 220-236 may be implemented by one or more digital and/or analog circuits.

Each of the one or more output connections 240-242 may be configured to add all the outputs from the one or more multipliers 220-236 together and then send the outputs from the one or more multipliers 220-236 after addition, to one of the one or more output nodes 210-212. For example, the output connection 240 may be configured to add the outputs from the multipliers 220-226 together, and send the outputs from the multipliers 220-226 after addition to the output node 210.

The one or more bias modules 214-216 may be configured to provide one or more biases. The one or more biases may include one or more current and/or voltage biases. The one or more biases may be sent to the one or more output connections 240-242, thus the output signals of the one or more output connections 240-242 can be biased to one or more desired ranges.

Figure 3:
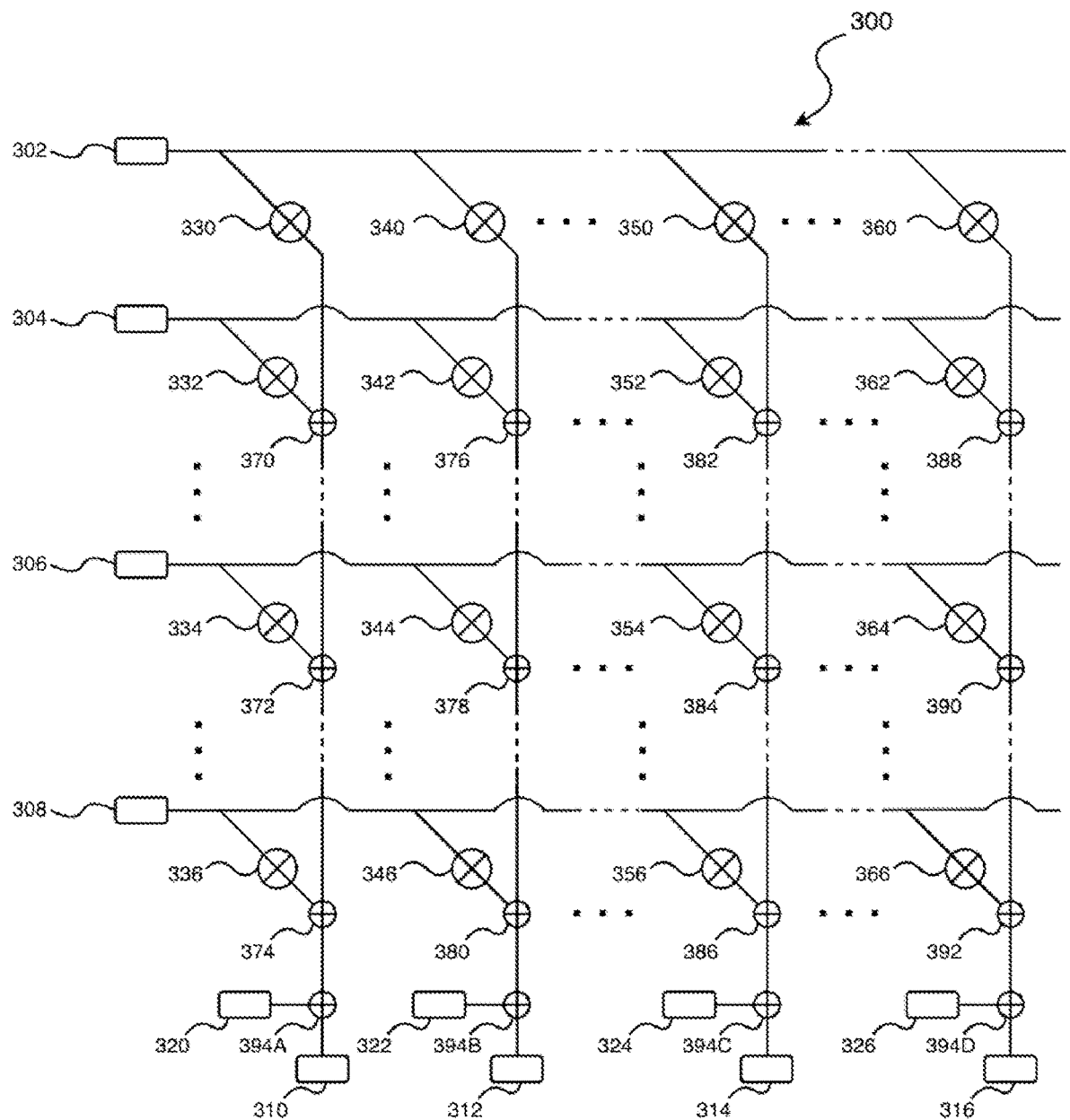
FIG. 3 illustrates an exemplary schematic diagram associated with FIG. 2 in accordance with a first embodiment described herein.

FIG. 3 illustrates an exemplary schematic diagram associated with FIG. 2 in accordance with a first embodiment described herein. A schematic diagram 300 includes one or more input nodes 302-308, one or more output nodes 310-316, one or more bias modules 320-326, one or more multipliers 330-366, one or more addition modules 370-392 and 394A-D. The one or more multipliers 330-366 include a multiplier 330, a multiplier 332, a multiplier 334, a multiplier 336, a multiplier 340, a multiplier 342, a multiplier 344, a multiplier 346, a multiplier 350, a multiplier 352, a multiplier 354, a multiplier 356, a multiplier 360, a multiplier 362, a multiplier 364 and a multiplier 366, as illustrated in FIG. 3. The one or more addition modules 370-392 include an addition module 370, an addition module 372, an addition module 374, an addition module 376, an addition module 378, an addition module 380, an addition module 382, an addition module 384, an addition module 386, an addition module 388, an addition module 390 and an addition module 392, as illustrated in FIG. 3.

Each of the one or more input nodes 302-308 may be configured to receive an input signal. The input signal may include a numerical dataset representing an image and/or a sound signal. For example, the input signal may include a numerical dataset of 784 pixel values representing an image of 28×28 pixels in greyscale. The input signal may be a digital signal. Each of the one or more input nodes 302-308 may be configured to send the input signal to the one or more multiplier 330-366. The one or more input nodes 302-308 may include the one or more input nodes 202-208 as illustrated in FIG. 2.

Each of the one or more multipliers 330-366 may comprise a register which may store the weight described in FIG. 2. In one embodiment, the weight may be an 8-bit binary code with a range from 0 to 255. Each of the one or more multipliers 330-366 may be configured to perform a multiplication operation. The multiplication operation may include multiplying each input signal from the one or more input nodes 302-308 with the weight. Each input signal after the multiplication operation may be sent to one of the one or more addition modules 370-392. For example, $X_1$ is the input signal from the input node 302, and $W_{11}$ is the weight stored in the register of the multiplier 330. The multiplier 330 may be configured to multiply $X_1$ with $W_{11}$, and output $X_1*W_{11}$ to the addition module 370.

Each of the one or more addition modules 370-392 may be configured to receive a signal from one of the one or more multipliers 330-366 and a signal from one of the one or more addition modules 370-392. Each of the one or more addition modules 370-392 may be configured to establish an output signal by adding the signals received from one of the one or more multipliers 330-366 and one of the one or more addition modules 370-392 together. Each of the one or more addition modules 370-392 may be configured to send the output signal after the addition operation to one of the one or more addition modules 370-392. In one example, the addition module 370 may be configured to receive a signal from the multiplier 330 which may be $X_1*W_{11}$, and a signal from the multiplier 332 which may be $X_2*W_{21}$. The digital addition module 370 may be configured to establish an output signal by adding the signals from the multiplier 330 and the multiplier 332 together. The output signal of the addition module 370 may be $X_1*W_{11}+X_2*W_{21}$. The addition module 370 may be configured to send the output signal to the addition module 372. In another example, the addition module 372 may be configured to receive a signal from the multiplier 334 which may be $X_3*W_{31}$, and a signal from the addition module 370 which may be $X_1*W_{11}+X_2*W_{21}$. The addition module 372 may be configured to establish an output signal by adding the signals from the multiplier 334 and the addition module 372 together. The output signal of the addition module 372 may be $X_1*W_{11}+X_2*W_{21}+X_3*W_{31}$. The addition module 372 may be configured to send the output signal to the addition module 374.

Each of the one or more bias modules 320-326 may be configured to output a bias signal as one of the input signals to the one or more addition modules 394A-D. The one or more bias signals from the one or more bias modules 320-326 may include one or more current and/or voltage biases.

Each of the one or more addition modules 394A-D may be configured to receive a signal from one of the one or more bias modules 320-326 and a signal from one of the one or more addition modules 370-392. Each of the one or more addition modules 394A-D may be configured to establish an output signal by adding the signals received from one of the one or more bias modules 320-326 and one of the one or more addition modules 370-392 together. Thus, the output signals of the one or more addition modules 394A-D can be biased to one or more desired ranges. Each of the one or more addition modules 394A-D may be configured to send the output signal to one of the one or more output nodes 310-316. For example, the addition module 394A may be configured to receive signals from the bias module 320 and the addition module 374. The addition module 394A may be configured to establish an output signal by adding the signals received from the bias module 320 and the addition module 374 together. The addition module 394A may be configured to send the output signal to the output node 310. In one embodiment, the bias module 320 may be configured to output a bias signal $B_1$ to the addition module 394A. In one embodiment, the addition module 394A may be configured to receive a signal of the addition module 374. The signal from the addition module 374 may be $X_1*W_{11}+X_2*W_{21}+X_3*W_{31}+X_4*W_{41}$. Thus, the output signal of the addition module 394A may be $X_1*W_{11}+X_2*W_{21}+X_3*W_{31}+X_4*W_{41}+B_1$.

Each of the one or more output nodes 310-316 may be configured to receive a signal from one of the one or more addition module 394A-D and output the signal. In some embodiments, the number of the input nodes in the schematic diagram 300 may be N. The output from each of the one or more output nodes 310-316 may be $Y_j$ (j=1, 2, 3 . . . ). Thus, the output of each of the one or more output nodes 310-316 may be expressed as following:

$$Y_j = \Sigma(X_i * W_{ij}) + B_j, (i=1 \text{ to } N) \qquad \text{Eqn. 1}$$

The advantage of the schematic diagram 300 may include a high output accuracy of digital circuits. However, a digital multiplier circuit may comprise a plurality of transistors. For example, a digital multiplier circuit may require three thousand transistors. This may result in high consumption of power and chip area for large scale digital circuit. Although in some embodiments, a digital multiplier circuit may be re-used by applying different input signals in sequence and storing corresponding output signals in a memory cell, this may result large amount of data transferring. When transferring a large amount of data by digital multiplier circuits, high frequency computing operation may be required as all data may need to be processed in a short time period.

One or more analog circuits can be configured to perform multiplication and addition operations with less power consumption and smaller chip area than digital circuits. For example, an analog multiplier circuit may only need less than 100 transistors to perform a multiplication operation, and a digital multiplier may need three thousand transistors. The fabrication processes of the one or more analog circuits are less complex that used in digital circuit fabrication.

However, the variability of identically designed analog devices in the one or more analog circuits has long been a concern since it directly affects the output variation of the one or more analog circuits. The output variation is caused by device mismatch. Device mismatch is due to the stochastic nature of physical processes that are used to fabricate the devices. Device mismatch is commonly seen in one or more transistors. In one example, the output of the first transistor is 0.6 v and the output of the second transistor is 1.2 v based on the same input of the first transistor and the second transistor of 1 v. The one or more transistors may be implemented to perform one or more multiplication operations, such as multiplying the one or more weights with one or more signals. The one or more weights may include the one or more input weights and/or the one or more output weights described in FIG. 1. For example, the one or more weights may include the input weight $W_{11}$. In one or more implementations, the smaller the dimensions of the one or more analog devices, the more device mismatch is introduced, resulting in more output variation. The output variation of the one or more analog circuits may cause the one or more weights not being equal to one or more desired values. For example, an analog circuit may be configured to perform a multiplication operation with the weight which is equal to 32. Due to the output variation, the analog circuit may perform the multiplication operation with the weight which is equal to 34. This causes a computing error.

To mitigate the impact of device mismatch and minimize the output variation of the one or more analog circuits, the present disclosure describes the system to calibrate the one or more analog circuits with the sub-binary radix representation. The sub-binary radix representation is implemented to represent the one or more weights with a radix less than 2. The sub-binary radix representation may include more bits that a binary radix representation, in order to maintain the same range as the binary radix representation. For example, a 3-bit binary radix representation has a range from 0 to 7. In order to achieve the same range, a sub-binary radix representation of radixes which are equal to 1.5 requires 4 bits. One or more extra bits of the sub-binary radix representation may be one or more redundancy bits.

In one or more implementations, at least one representation may be corresponded to each of the one or more weights to fully represent a desired range of values associated with each of the one or more weights. The at least one representation may include the sub-binary radix representation. With the one or more redundancy bits, the sub-binary radix representation has a higher bit resolution than the binary radix representation of the same desired range of values. In some embodiments, a value associated with the weight in the desired range may have different representations by with the sub-binary radix representation. For example, sub-binary representations of 1000 and/or 0110 with the radix which is equal to 1.618 may be implemented to represent a value of 4.236. The different representations by with the sub-binary radix representation may allow different configurations of the one or more analog circuits to be implemented. The different configurations may include a first configuration and/or a second configuration of the one or more analog circuits. The first configuration may produce less computing error than the second configuration. By selecting the configuration of the one or more analog circuit with the least computing error, the impact of the output variation is reduced. The one or more redundancy bits of the sub-binary radix representation may allow the system to achieve a desired computation accuracy and bit resolution, as will be described below with reference to FIG. 4-9B.

Figure 4:
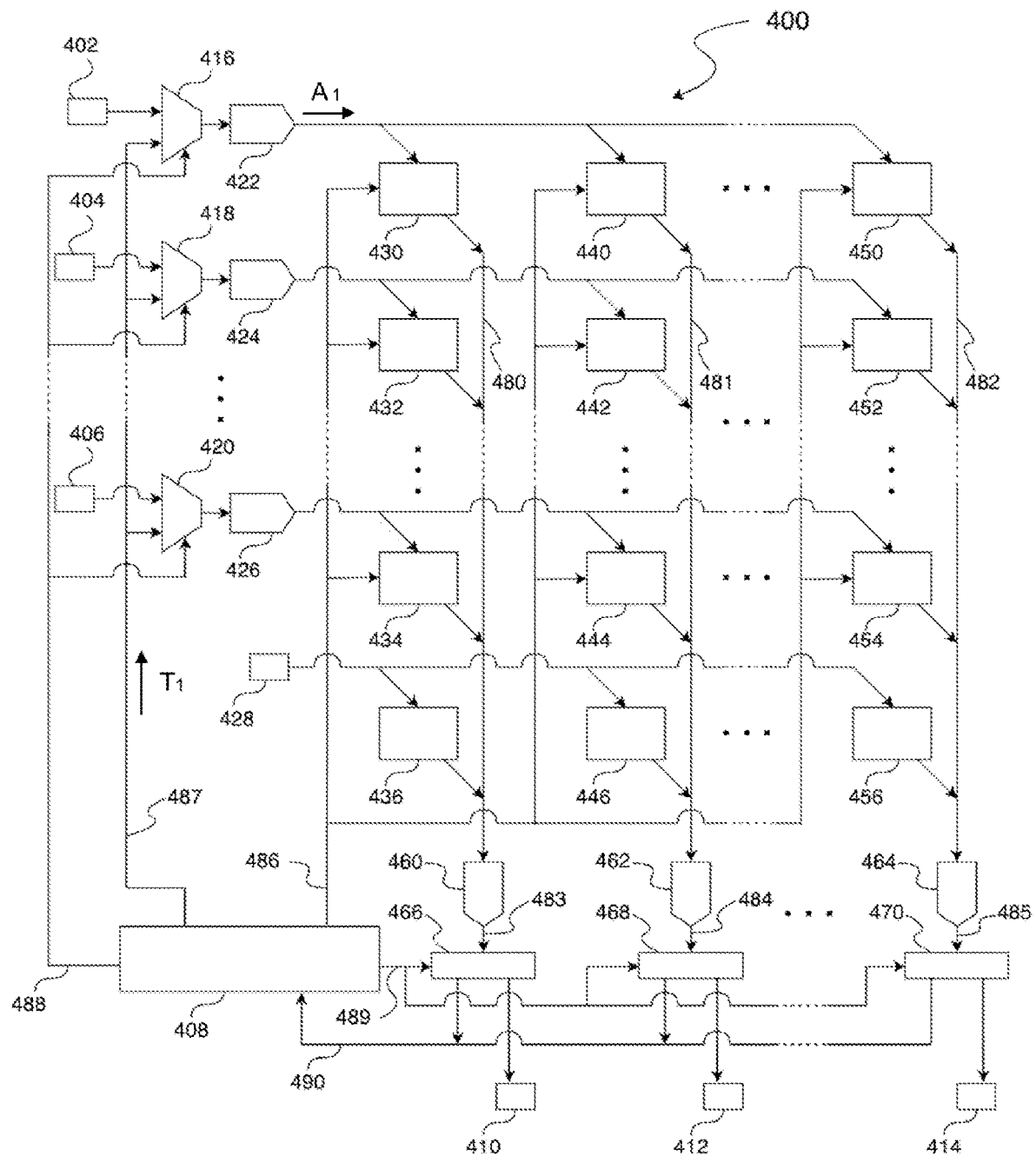
FIG. 4 illustrates an exemplary schematic diagram associated with FIG. 2 with a plurality of SRAM-based Sub-Binary Multipliers (SSBM) in accordance with a second embodiment described herein.

FIG. 4 illustrates an exemplary schematic diagram associated with FIG. 2 in accordance with a second embodiment described herein with a plurality of SRAM-based Sub-Binary Multipliers (SSBM). The one or more analog circuits may be implemented in the plurality of SSBM to reduce power consumption and chip area usage. Not all of the depicted components may be used, however, and one or more implementations may include additional components not shown in the figure. Variations in the arrangement and types of the components may be made without departing from the spirit or scope of the claims as set forth herein. Additional, different or fewer components may be provided.

As described above, to mitigate the impact of device mismatch and minimize the output variation of the one or more analog circuits, the present disclosure describes the system to calibrate the one or more analog circuits with the sub-binary radix representation. The sub-binary radix representation may include a radix less than 2. For example, the radix may be 1.5. The sub-binary radix representation may comprise a redundancy which allows the system to achieve the desired computation accuracy and bit resolution.

A schematic diagram 400 illustrated in FIG. 4, includes one or more input nodes 402-406, a calibration module 408, one or more output nodes 410-414, one or more multiplexers (MUX) 416-420, one or more digital to analog converters (DAC) 422-426, a bias module 428, one or more SRAM-based Sub-Binary Multipliers (SSBM) 430-456, one or more analog to digital converters (ADC) 460-464, one or more switches 466-470, one or more output buses 480-482, one or more digital output buses 483-485, a code bus 486, a calibration input bus 487, a calibration MUX control line 488, a calibration bus control line 489, a calibration output bus 490. The one or more SSBM 430-456 include a SSBM 430, a SSBM 432, a SSBM 434, a SSBM 436, a SSBM 440, a SSBM 442, a SSBM 444, a SSBM 446, a SSBM 450, a SSBM 452, a SSBM 454 and a SSBM 456, as illustrated in FIG. 4.

As one or more analog circuits may be implemented in the schematic diagram 400 to reduce power consumption and chip area usage, the device mismatch of the one or more analog circuits may cause the output variation.

In some embodiments, the calibration module 408 may be configured to control the schematic diagram 400 to switch between a normal operation mode and a calibration mode. Prior to configuring the schematic diagram 400 to the normal operation mode, the calibration module 408 may be configured to control the schematic diagram 400 to the calibration mode to be in a first process, such as including a calibration process. The schematic diagram 400 may be configured to perform the first process to mitigate the impact of device mismatch and minimize the output variation of the one or more analog circuits.

The first process may be performed as described in details as below. The first process may be performed before the schematic diagram 400 is configured to operate in the normal operation mode and/or any other operations.

To start the first process, each of the one or more MUX 416-420 may be configured to receive a calibration input signal from the calibration module 408. Each of the one or more MUX 416-420 may comprise one or more inputs, including the one or more input nodes 402-406 and/or the calibration module 408. The calibration input signal may be a digital signal, such as $T_1$. $T_1$ may be an 8-bit digital signal with all bits which are equal to 1. $T_1$ may be configured by the calibration module 408.

The one or more MUX 416-420 may be controlled by the calibration module 408 via the calibration MUX control line 488. Each of the one or more MUX 416-420 may be configured to output the calibration input signal from the calibration module 408 to one of the one or more DAC 422-426. The calibration module 408 may be configured to send the calibration input signal to the one or more MUX 416-420 via the calibration input bus 487 during the first process. In one example, each of the one or more MUX 416-420 may be configured to output the calibration input signal from the calibration module 408 in the first process.

Thus, each of the one or more MUX 416-420 may be configured to output the digital signal $T_1$.

In the first process, each of the one or more DAC 422-426 may be configured to perform a digital-to-analog conversion to the calibration input signal from one of the one or more MUX 416-420. The calibration input signal from one of the one or more MUX 416-420 may be converted to an analog signal, and the analog signal may be sent to the one or more SSBM 430-456. For example, MUX 416 may output the calibration input signal $T_1$ to the DAC 422. The calibration input signal $T_1$ may be a digital signal. The DAC 422 may convert $T_1$ to an analog signal $A_1$. The analog signal $A_1$ may be sent to the SSBM 430, the SSBM 440 and/or the SSBM 450.

The bias module 428 may be configured to output an analog bias signal to the one or more SSBM 430-456. The analog bias signal from the bias module 428 may include an analog current signal and/or an analog voltage signal.

Each of the one or more SSBM 430-456 may be configured to receive an analog input signal from one of the one or more DAC 422-426 or the bias module 428. Each of the one or more SSBM 430-456 may include one or more SRAM cells. Each of the one or more SSBM 430-456 may be configured to store a weight parameter in the SRAM cells. The weight parameter may be configured by the calibration module 408 via the code bus 486 in the first process. In some embodiments, the weight parameter may be a 10-bit parameter. In some embodiments, 2 bits of the 10-bit weight parameter may be implemented as redundancy bits. In some embodiments, the weight parameter may be implemented together with the sub-binary radix, such as the radix which is equal to 1.5. The weight parameters combining with the sub-binary radixes may be implemented to represent the weights described in FIG. 1, FIG. 2 and/or FIG. 3. For example, the weight parameter may be 0110, from MSB to LSB. The sub-binary radix may be 1.5. Each bit of the weight parameter may be multiplied with the sub-binary radixes with powers ranging from 0 to 3. The result of the multiplication of each bit of the weight parameter and the sub-binary radixes may be added together. The weight parameters combining with the sub-binary radixes ($R_{sb}$) may be expressed as following:

$$R_{sb}=0*1.5^3+1*1.5^2+1*1.5^1+0*1.5^0 \qquad \text{Eqn. 2}$$

which results in a value of 3.75. Thus, the weight parameters combining with the sub-binary radixes may represent the weight with the value of 3.75.

In the first process, each of the one or more SSBM 430-456 may be configured to establish an analog output signal by multiplying the analog input signal from one of the one or more DAC 422-426 or the bias module 428 with the weight parameter stored in the one or more SRAM cells. For example, a weight parameter $S_{11}$ may be stored in the SRAM cell of the SSBM 430. The DAC 422 may send the analog signal $A_1$ to the SSBM 430. The SSBM 430 may be configured to establish an analog output signal by multiplying $A_1$ and $S_{11}$. Thus, the analog output signal from the SSBM 430 may be $A_1*S_{11}$. The multiplication of the analog input signal from one of the one or more DAC 422-426 or the bias module 428, with the weight parameter stored in the one or more SRAM cells may be established by one or more analog circuits in the calibration system to reduce power consumption and chip area usage. In one embodiment, the analog input signal from one of the one or more DAC 422-426 or the bias module 428, may be multiplied by each bit of the weight parameter stored in the SRAM cells of the one or more SSBM 430-456, which will be discussed in details with reference to FIG. 5A and FIG. 5B. Each of the one or more SSBM 430-456 may be configured to send the analog output signal to one of the one or more output buses 480-482. In one embodiment, the analog output signal from each of the one or more SSBM 430-456 may include a bus signal.

For example, the weight parameter $S_{11}$ stored in the SRAM cell of SSBM 430 may be a 10-bit parameter, such as $[S_{11\_1}, S_{11\_2}, S_{11\_3} \ldots S_{11\_10}]$, from MSB to LSB. The SSBM 430 may be configured to receive the analog signal $A_1$ from the DAC 422, and perform one or more multiplication operations. The one or more multiplication operations may include multiplying the analog signal $A_1$ with each bit of the weight parameter $S_{11}$. Thus, the analog output signal from the SSBM 430 after multiplication may be a bus signal, such as $[A_1*S_{11\_1}, A_1*S_{11\_2}, A_1*S_{11\_3} \ldots A_1*S_{11\_10}]$. The SSBM 430 may be configured to send the analog output signal to the output bus 480.

In the first process, the calibration module 408 may be configured to calibrate the one or more weight parameter stored in the one or more SSBM 430-456. The one or more weight parameter stored in the one or more SSBM 430-456 may be configured from a lowest value to a highest value by the calibration module 408 via the code bus 486. For example, the weight parameter $S_{11}$ stored in the SSBM 430 may be a 10-bit code. In the first process, $S_{11}$ may be configured from a lowest value, such as 0000000000 to a highest value, such as 1111111111. The calibration module 408 may be configured to calibrate one of the one or more weight parameters at a time. For example, the calibration module 408 may be configured to only configure the weight parameter $S_{11}$ stored in SSBM 430 with different values, and keep the others of the one or more weight parameters stored in the one or more SSBM 432-456 as 0. Every time when the calibration module 408 configures one of the one or more weight parameters stored in the one or more SSBM 430-456 with a value, one of the one or more SSBM 430-456 may send a corresponding analog output signal to one of the one or more output buses 480-482.

Each of the one or more output buses 480-482 may be configured to receive the analog output signals from the one or more SSBM 430-456, and send the analog output signals to one of the one or more ADC 460-464. When more than one of the one or more SSBM 430-456 are connected to one of the one or more output buses 480-482 at approximately the same time, the analog output signals from the more than one of the one or more SSBM 430-456 may be directly added together. In one embodiment, compared to the one or more addition modules 370-392 in the schematic diagram 300 of FIG. 3, no addition module is implemented in the schematic diagram 400 to reduce power consumption and chip area. For example, the SSBM 430 may be configured to send an analog output signal $R_1$ to the output bus 480, the SSBM 432 may be configured to send an analog output signal $R_2$ to the output bus 480. The analog output signal $R_1$ may be a bus signal, such as $[A_1*S_{11\_1}, A_1*S_{11\_2}, A_1*S_{11\_3} \ldots A_1*S_{11\_10}]$. The analog output signal $R_2$ may be a bus signal, such as $[A_2*S_{21\_1}, A_2*S_{21\_2}, A_2*S_{21\_3} \ldots A_2*S_{21\_10}]$. The analog output signal $R_1$ and the analog output signal $R_2$ may be sent to the output bus 480 at approximately the same time. The analog output signal $R_1$ and the analog output signal $R_2$ may be added together in the output bus 480. The output bus 480 may be configured to send the addition of $R_1$ and $R_2$ (e.g., $R_1+R_2$) to the ADC 460, such as $[A_1*S_{11\_1}+A_2*S_{21\_1}, A_1*S_{11\_2}+A_2*S_{21\_2}, A_1*S_{11\_3}+A_2*S_{21\_3}, \ldots A_1*S_{11\_10}+A_2*S_{21\_10}]$.

Each of the one or more ADC 460-464 may include one or more multipliers with one or more weight radixes, which will be discussed in details with reference to FIG. 9A and FIG. 9B. In one embodiment, the one or more weight radixes may be a plurality of radixes (r) to the powers from N−1 to 0, such as $[r^{N-1}, r^{N-2}, \ldots r^2, r^1, r^0]$. The number N may be equal to the number of bits of the weight parameters stored in the one or more SRAM cells of the one or more SSBM 430-456. The one or more weight radixes may be one or more sub-binary radixes, including, for example, the radixes which are equal to 1.5.

In the first process, each of the one or more ADC 460-464 may be configured to receive the analog output signal from one of the one or more output buses 480-482 and to perform a multiplication operation and followed by an addition operation. The multiplication operation may include multiplying the analog output signal from one of the one or more output buses 480-482 with the one or more weight radixes to establish one or more weighted analog output signals. The multiplication operation may be established by one or more analog circuits to reduce power consumption and chip area. The addition operation may include adding one or more weighted analog output signals together to establish a combined analog output signal.

For example, the analog output signal from the output bus 480 may be $[A_1 *S_{11\_1}+A_2 *S_{21\_1}, A_1 *S_{11\_2}+A_2 *S_{21\_2}, A_1 *S_{11\_3}+A_2 *S_{21\_3}, \ldots A_1 *S_{11\_10}+A_2 *S_{21\_10}]$. The ADC 460 may multiply the analog output signal from the output bus 480 with the one or more weight radixes included in the ADC 460. The weight parameters stored in the SRAM cells of one or more SSBM 430-456 may be a 10-bit code. N may be equal to 10. Therefore, the one or more weight radixes may be $[r^9, r^8, \ldots r^1, r^0]$. Thus, the weighted analog output signal established by the ADC 460 may be $Y_1$, which may be expressed as following:

$$Y_1 = [(A_1 *S_{11\_1}+A_2 *S_{21\_1})*r^9, (A_1 *S_{11\_2}+A_2 *S_{21\_2})* r^8, \ldots (A_1 *S_{11\_10}+A_2 *S_{21\_10})*r^0]$$ Eqn. 3

The combined analog output signal may be $Z_1$, which may be expressed as following:

$$Z_1 = (A_1 *S_{11\_1}+A_2 *S_{21\_1})*r^9 + (A_1 *S_{11\_2}+A_2 *S_{21\_2})* r^8 \ldots + (A_1 *S_{11\_10}+A_2 *S_{21\_10})*r^0$$ Eqn. 4

Each of the one or more ADC 460-464 may be configured to convert the combined analog output signal, for example, $Z_1$ in eqn. 3 to a digital output signal. The digital output signal from each of the one or more ADC 460-464 may be sent to one of the one or more switches 466-470 via one of the one or more digital output buses 483-485. For example, the ADC 460 may send the combined analog output signal $Z_1$ to the switch 466 via the digital output bus 483.

Each of the one or more switches 466-470 may be controlled by the calibration module 408 via the calibration bus control line 489. Each of the one or more switches 466-470 may be configured to output the digital output signal from one of the one or more ADC 460-464 to the calibration module 408 in the first process. The calibration output bus 490 may be configured to receive the digital output signal from one of the one or more switches 466-470, and send the digital output signal to the calibration module 408 during the first process. In one example, the switch 466 may be configured to output the digital output signal $Z_1$ from the ADC 460 to the calibration module 408 via the calibration output bus 490 in the first process.

In the first process, the calibration module 408 may be configured to send one or more calibration input signals to the one or more MUX 416-420. Each of the one or more calibration input signals may have a corresponding calibration output signal. Every time when the calibration module 408 configures one of the one or more weight parameters stored in the one or more SSBM 430-456 with a value, the one or more switch 466-470 may output a corresponding digital output signal to the calibration module 408.

The calibration module 408 may be configured to compare the digital output signal with the corresponding calibration output signal associated to the calibration input signal and establish an error value. The error value may be the discrepancy between the digital output signal and the corresponding calibration output signal. As one of the one or more weight parameter being configured with different values, the error value may change accordingly. When the error value is within an acceptable range, the calibration module 408 may store the value of the weight parameter as a calibrated weight parameter. The calibration module 408 may be configured to calibrate all of the one or more weight parameters stored in the one or more SSBM 430-456 in calibration mode prior to configure the schematic diagram 400 to the normal operation mode. When the calibration module 408 is configured to store the calibrated weight parameter for each of the one or more weight parameters stored in the one or more SSBM 430-456, the first process may be completed.

Upon the completion of the first process, schematic diagram 400 may be configured in the normal operation mode, for example by the calibration module 408. Calibration module 408 may be configured to configure each of the one or more weight parameters stored in the one or more SSBM 430-456 with the corresponding value of the calibrated weight parameter.

In the normal operation mode, each of the one or more input nodes 402-406 may be configured to receive an input signal and output the input signal to one of the one or more MUX 416-420. The input signal may include a numerical dataset representing an image and/or a sound signal. For example, the input signal, such as $X_1$, may include 784 numeric pixel values as inputs from an image of 28×28 pixels. The input signal $X_1$ may be a digital signal. The one or more input nodes 402-406 may include the one or more input nodes 202-208 as illustrated in FIG. 2.

In the normal operation mode, the one or more MUX 416-420 may be configured to receive the one or more input signals from one of the one or more input nodes 402-406, and output the one or more input signals to the one or more DAC 422-426. The one or more DAC 422-426 may be configured to perform one or more digital-to-analog conversions to the one or more input signals, and send one or more analog input signals to the one or more SSBM 430-456.

Each of the one or more SSBM 430-456 may be configured to establish the analog output signals by multiplying the analog input signal from one of the one or more DAC 422-426 or the bias module 428 with each bit of the calibrated weight parameter stored in the one or more SRAM cells. Each of the one or more output buses 480-482 may be configured to receive the analog output signals from the one or more SSBM 430-456, and send the analog output signals to one of the one or more ADC 460-464. Each of the one or more ADC 460-464 may be configured to receive the analog output signal from one of the one or more output buses 480-482 and to perform a multiplication operation and followed by an addition operation. The multiplication operation may include multiplying the analog output signal from one of the one or more output buses 480-482 with the one or more weight radixes to establish one or more weighted analog output signals. The addition operation may include adding one or more weighted analog output signals together to establish a combined analog output signal.

The one or more ADC 460-464 may be configured to perform an analog-to-digital conversion to the combined analog output signal, and output a digital output signal to the one or more switch 466-470.

Each of the one or more switches 466-470 may be configured to output the digital output signal from one of the one or more ADC 460-464 to one of the one or more output nodes 410-414 in the normal operation mode. In one example, the switch 466 may be configured to output the digital output signal $Z_1$ from the ADC 460 to the output node 410 in the normal operation process. Each of the one or more output nodes 410-414 may be configured to output the digital output signal from one of the one or more switch 466-470 as the output signal of the schematic diagram 400.

Figure 5A:
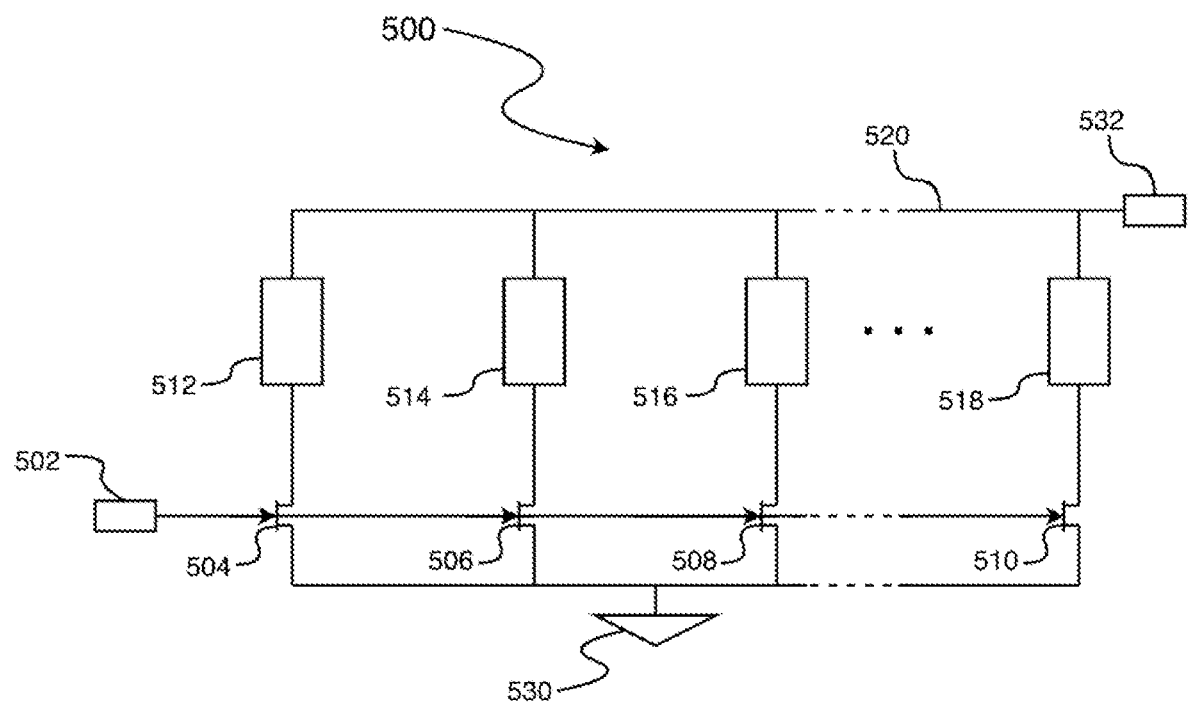
FIG. 5A illustrates an exemplary schematic diagram of SSBM in FIG. 4 in accordance with a first embodiment described herein.

FIG. 5A illustrates an exemplary schematic diagram of SSBM in FIG. 4 in accordance with a first embodiment described herein. A SSBM unit 500 illustrated in FIG. 5A, includes an input 502, one or more transconductors 504-510, one or more multipliers 512-518, an output bus 520, a ground terminal 530 and an output 532.

The input 502 may be configured to receive an input signal, and send the input signal to the one or more transconductors 504-510. For example, the input 502 may be configured to receive the input signal, such as $A_1$. The input signal $A_1$ may be sent to the one or more transconductors 504-510.

Each of the one or more transconductors 504-510 may include continuous-time filters, variable gain-amplifier and/or data converter. The one or more transconductors 504-510 may be configured to perform voltage-to-current conversion.

Each of the one or more transconductors 504-510 may be configured to receive the input signal from the input 502 and output a current signal to one of the one or more multipliers 512-518. The current signal may be associated with the input signal. In one embodiment, the input signal may be a voltage signal. Each of the one or more transconductors 504-510 may be configured to receive the voltage signal and output the current signal. In some embodiments, the one or more transconductors 504-510 may include one or more variable-gain amplifiers. In some embodiments, the one or more transconductors 504-510 may include one or more field effect transistors. For example, the transconductor 504 may be a MOSFET transistor. The transconductor 504 may be configured to receive the input signal $A_1$ from the input 502 and output the current signal, such as $AC_1$. The input signal $A_1$ may be the voltage signal sent to the input of the transconductor 504, such as the gate of the MOSFET transistor. The current signal $AC_1$ may be output from the output of the transconductor 504, such as the drain of the MOSFET transistor. The current signal $AC_1$ may be sent to the multiplier 512.

Each of the one or more multipliers 512-518 may include a SRAM cell to store one bit of the weight parameter, for example from MSB to LSB, correspondingly. For example, the one or more multipliers 512-518 may be configured to store the 10-bit weight parameter $S_{11}$, such as $[S_{11\_1}, S_{11\_2}, S_{11\_3} \ldots S_{11\_10}]$, from MSB to LSB, correspondingly. Each of the one or more multipliers 512-518 may be associated with a corresponding one bit of the weight parameter. In one example, the multiplier 512 may store the MSB, such as $S_{11\_1}$. The multiplier 512 may be associated with a corresponding one bit of the weight parameter, such as $S_{11\_1}$. In another example, the multiplier 514 may store the second MSB, such as $S_{11\_2}$. The multiplier 514 may be associated with a corresponding one bit of the weight parameter, such as $S_{11\_2}$. The one or more SRAM cells included in the one or more multipliers 512-518 may include the one or more SRAM cells of the one or more SSBM 430-456 described in FIG. 4.

As described above, each of the one or more multipliers 512-518 may be associated with a corresponding one bit of the weight parameter. Each of the one or more multipliers 512-518 may be configured to establish an output signal by multiplying the input signal from one of the one or more transconductors 504-510 with the corresponding one bit of the weight parameter, such as the corresponding one bit of the weight parameter stored in the SRAM cell. Each of the one or more multipliers 512-518 may be configured to output the output signal to the output bus 520. For example, the multiplier 512 may be configured to receive the current signal $AC_1$ from the transconductor 504. The multiplier 512 may be configured to store $S_{11\_1}$ in the SRAM cell. The multiplier 512 may establish the output signal by multiplying $AC_1$ with $S_{11\_1}$. The multiplier 512 may output $AC_1*S_{11\_1}$ to the output bus 520.

The output bus 520 may be a signal bus that can transfer one or more signals at approximately the same time. The output bus 520 may be configured to receive one or more output signals from the one or more multipliers 512-518. The output bus 520 may be configured to transfer the one or more output signals to the output 532. For example, the one or more multipliers 512-518 may output $[AC_1*S_{11\_1}, AC_1*S_{11\_2}, AC_1*S_{11\_3} \ldots AC_1*S_{11\_10}]$ to the output bus 520. The output bus 520 may transfer $[AC_1*S_{11\_1}, AC_1*S_{11\_2}, AC_1*S_{11\_3} \ldots AC_1*S_{11\_10}]$ at approximately the same time to the output 532.

The output 532 may be configured to output the one or more output signals from the output bus 520 to one of the one or more output buses 480-482 as illustrated in FIG. 4. The ground terminal 530 may be connected to the one or more transconductors 504-510. The ground terminal 530 may be configured to provide the ground connection to the one or more transconductors 504-510.

Figure 5B:
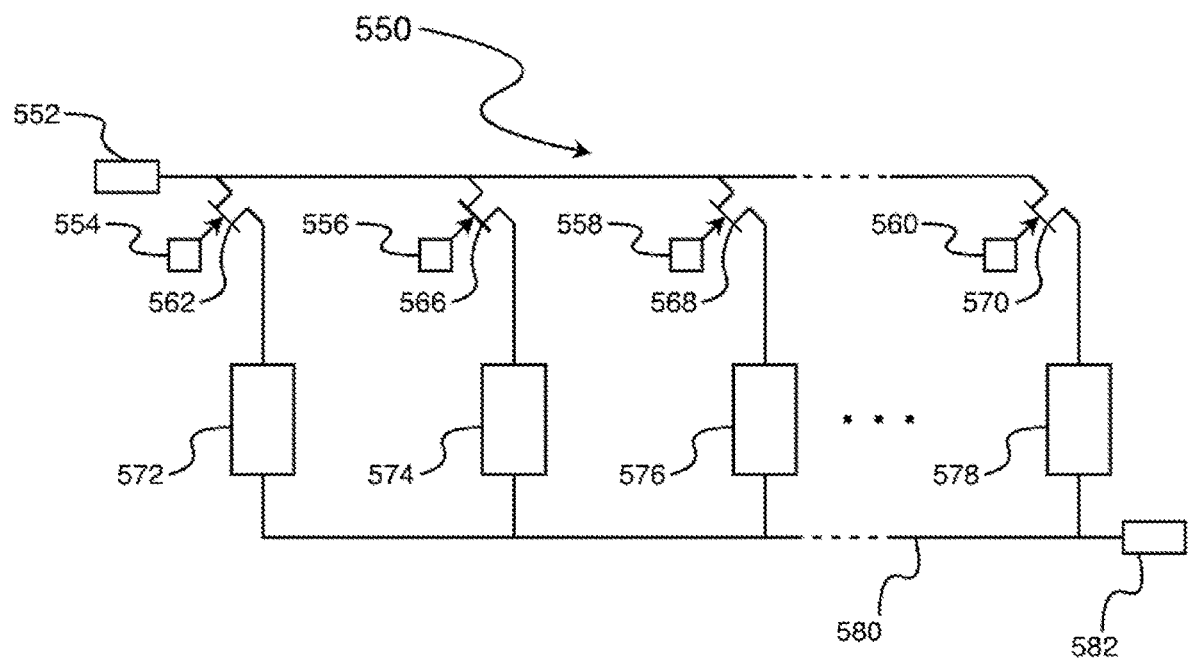
FIG. 5B illustrates an exemplary schematic diagram of SSBM in FIG. 4 in accordance with a second embodiment described herein.

FIG. 5B illustrates an exemplary schematic diagram of SSBM in FIG. 4 in accordance with a second embodiment described herein. A SSBM unit 550 illustrated in FIG. 5B, includes an input 552, one or more voltage inputs 554-560, one or more transistors 562-570, one or more multipliers 572-578, an output bus 580 and an output 582.

The input 552 may be configured to receive an input signal, and send the input signal to the one or more transistors 562-570. For example, the input 552 may be configured to receive the input signal, such as $A_1$. The input signal $A_1$ may be sent to the one or more transistors 562-570.

Each of the one or more voltage inputs 554-560 may be connected to one of the one or more transistors 562-570. In some embodiments, the one or more transistors 562-570 may include one or more bipolar junction transistors (BJT). In some embodiments, each of the one or more voltage inputs 554-560 may be connected to the base of one of the one or more BJT. Each of the one or more voltage inputs 554-560 may be configured to control the collector-emitter current of one of the one or more BJT. In some embodiments, the one or more transistors 562-570 may include one or more field effect transistors (FET).

In some embodiments, each of the one or more voltage input 554-560 may be connected to the gate of the one or more FET. Each of the one or more voltage inputs 554-560 may be configured to control the drain-source current of one of the one or more FET.

Each of the one or more transistors 562-570 may be configured to receive the input signal from the input 552 and output a current signal to one of the one or more multipliers 572-578. The current signal may be associated to the input signal. In one embodiment, the input signal may be a first current signal. The one or more current signals outputted from each of the one or more transistors may be one or more second current signals. Each of the one or more transistors 562-570 may be configured to receive the first current signal and output the second current signal. In some embodiments, the one or more transistors 562-570 may include one or more bipolar junction transistors (BJT). For example, the transistor 562 may be a BJT. The transistor 562 may be configured to receive the first current signal $A_1$ from the input 552 and output the second current signal, such as $AC_1$. The input signal $A_1$ may be sent to the input of the transistor 562, such as the collector of the BJT. The current signal $AC_1$ may be outputted from the output of the transistor 562, such as the emitter of the BJT. The current signal $AC_1$ may be sent to the multiplier 572. In some embodiments, the one or more transistors 562-570 may include one or more field effect transistors (FET). For example, the transistor 562 may be a FET. The transistor 562 may be configured to receive the first current signal $A_1$ from the input 552 and output the second current signal, such as $AC_1$. The input signal $A_1$ may be sent to the input of the transistor 562, such as the source of the FET. The current signal $AC_1$ may be outputted from the output of the transistor 562, such as the drain of the FET. The current signal $AC_1$ may be sent to the multiplier 572.

Each of the one or more multipliers 572-578 may include a SRAM cell to store one bit of the weight parameter, for example from MSB to LSB, correspondingly. For example, the one or more multipliers 572-578 may be configured to store the 10-bit weight parameter $S_{11}$, such as $[S_{11\_1}, S_{11\_2}, S_{11\_3} \ldots S_{11\_10}]$, from MSB to LSB, correspondingly. Each of the one or more multipliers 572-578 may be associated with a corresponding one bit of the weight parameter. In one example, the multiplier 572 may be configured to store the MSB, such as $S_{11\_1}$. The multiplier 512 may be associated with a corresponding one bit of the weight parameter, such as $S_{11\_1}$. In another example, the multiplier 574 may be configured to store the second MSB, such as $S_{11\_2}$. The multiplier 514 may be associated with a corresponding one bit of the weight parameter, such as $S_{11\_2}$. The one or more SRAM cells included in the one or more multipliers 572-578 may include the one or more SRAM cells of the one or more SSBM 430-456 described in FIG. 4.

As described above, each of the one or more multipliers 572-578 may be associated with a corresponding one bit of the weight parameter. Each of the one or more multipliers 572-578 may be configured to establish an output signal by multiplying the input signal from one of the one or more transistors 562-570 with the corresponding one bit of the weight parameter stored in the SRAM cell. Each of the one or more multipliers 572-578 may be configured to output the output signal to the output bus 580. For example, the multiplier 572 may be configured to receive the current signal $AC_1$ from the transistor 562. The multiplier 572 may be configured to store $S_{11\_1}$ in the SRAM cell. The multiplier 572 may be configured to establish the output signal by multiplying $AC_1$ with $S_{11\_1}$. The multiplier 572 may be configured to output $AC_1*S_{11\_1}$ to the output bus 580.

The output bus 580 may be a signal bus that can transfer one or more signals at approximately the same time. The output bus 580 may be configured to receive one or more output signals from the one or more multipliers 572-578. The output bus 580 may be configured to transfer the one or more output signals to the output 582. For example, the one or more multipliers 572-578 may be configured to output $[AC_1*S_{11\_1}, AC_1*S_{11\_2}, AC_1*S_{11\_3} \, AC_1*S_{11\_10}]$ to the output bus 580. The output bus 580 may be configured to transfer $[AC_1*S_{11\_1}, AC_1*S_{11\_2}, AC_1*S_{11\_3} \ldots AC_1*S_{11\_10}]$ at approximately the same time to the output 582.

The output 582 may be configured to output the one or more output signals from the output bus 580 to one of the one or more output buses 480-482 as illustrated in FIG. 4.

Figure 6:
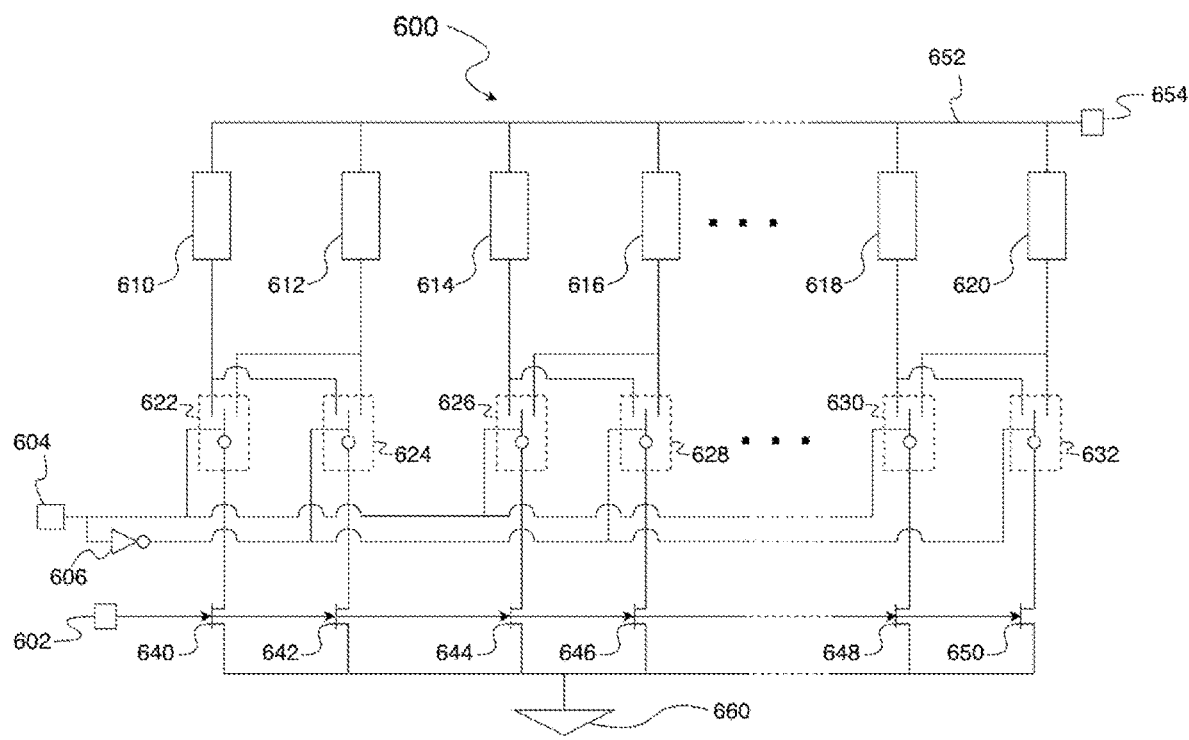
FIG. 6 illustrates an exemplary schematic diagram of SSBM in FIG. 4 in accordance with a third embodiment described herein.

FIG. 6 illustrates an exemplary schematic diagram of SSBM in FIG. 4 in accordance with a third embodiment described herein. A SSBM unit 600 illustrated in FIG. 6, includes an input 602, a control input 604, an inverter 606, one or more multipliers 610-620, one or more switches 622-632, one or more transconductors 640-650, an output bus 652, an output 654 and a ground terminal 660.

The input 602 may be configured to receive an input signal, and send the input signal to the one or more transconductors 640-650. For example, the input 602 may be configured to receive the input signal, such as $A_1$. The input signal $A_1$ may be sent to the one or more transconductors 640-650.

Each of the one or more transconductors 640-650 may be configured to receive the input signal from the input 602 and output a current signal to one of the one or more switches 622-632. The current signal may be associated to the input signal. In one embodiment, the input signal may include the voltage signal described in FIG. 5A. Each of the one or more transconductors 640-650 may be configured to receive the voltage signal and output the current signal. In some embodiments, the one or more transconductors 640-650 may include one or more variable-gain amplifiers. In some embodiments, the one or more transconductors 640-650 may include one or more filed effect transistors. For example, the transconductor 640 may be a MOSFET transistor. The transconductor 640 may be configured to receive the input signal $A_1$ from the input 602 and output the current signal, such as $AC_1$. The input signal $A_1$ may be the voltage signal sent to the input of the transconductor 640, such as the gate of the MOSFET transistor. The current signal $AC_1$ may be output from the output of the transconductor 640, such as the drain of the MOSFET transistor. The current signal $AC_1$ may be sent to the switch 622.

The control input 604 may be configured to send a control signal to the inverter 606 and/or the one or more switches 622-632. The inverter 606 may be configured to receive the control signal from the control input 604 and output an inverted control signal to the one or more switch 622-632. In one embodiment, the control signal may be a 1-bit signal, such as 1. In one embodiment, the control signal may be a 1-bit signal, such as 0.

Each of the one or more switches 622-632 may comprise an input, a first output, a second output and a control port. Each of the one or more switches 622-632 may be configured to receive a data signal from the input. For example, the switch 622 may be configured to connect to the transconductor 640 to the input. Thus, the switch 622 may be configured to receive the data signal, such as the current signal $AC_1$, from the transconductor 640. Each of the one or more switches 622-632 may be configured to receive a control signal at the control port. Each of the one or more switches 622-632 may be configured to output the data signal to the first output and/or the second output according to the control signal received at the control port. In one embodiment, when the control signal is 0, each of the one or more switches 622-632 may be configured to output the data signal to the first output. In one embodiment, when the control signal is 1, each of the one or more switches 622-632 may be configured to output the data signal to the second output. For example, the switch 622 may be configured to receive the control signal, such as 0. The switch 622 may be configured to output $AC_1$ to the first output. In another example, the switch 622 may be configured to receive the control signal, such as 1. The switch 622 may be configured to output $AC_1$ to the second output.

Each of the one or more switches 622-632 may be grouped as a first group of switches and/or a second group of switches. For example, the switch 622, the switch 626 and the switch 630 may be the first group of switches; the switch 624, the switch 628 and the switch 632 may be the second group of switches. The first group of switches may be configured to receive the control signal from the control input 604. The second group of switches may be configured to receive the inverted control signal from the inverter 606. Thus, the first group of switches and the second group of switches may be configured to receive different control signals. The first group of switches and the second group of switches may be configured to output the data signal differently. For example, the switch 622 may be one of the first group of switches, and the switch 624 may be one of the second group of switches. When the control signal is 0 and the inverted control signal is 1, the switch 622 may be configured to receive the control signal, such as 0, and the switch 624 may be configured to receive the inverted control signal, such as 1. Thus, the switch 622 may be configured to output the data signal to the first output, and the switch 624 be configured to may output the data signal to the second output.

Each of the one or more switches 622-632 may be configured to connect to two of the one or more multipliers 610-620 with the first output and/or the second output. Each of the one or more multipliers 610-620 may be connected with one of the one or more first group of switches and one of the one or more second group of switches with the same output. For example, the multiplier 610 may be connected to the first output of the switch 622 and the first output of the switch 624. In another example, the multiplier 612 may be connected to the second output of the switch 622 and the second output of the switch 624.

By being connected to the same output of one of the one or more first group of switches and one of the one or more second group of switches, each of the one or more multipliers 610-620 may be configured to receive only one data signal from the one or more switches 622-632. For example, the multiplier 610 may be connected to the first output of the switch 622 and the first output of the switch 624. The switch 622 may be configured to receive the data signal such as $AC_1$. The switch 624 may be configured to receive the data signal such as $AC_2$. When the control signal is 0, the switch 622 may be configured to receive the control signal as 0, and the switch 624 may be configured to receive the inverted control signal as 1. Thus, the switch 622 may be configured to output $AC_1$ to the first output which may be connected with the multiplier 610, and the switch 624 may be configured to output $AC_2$ to the second output which may not be connected with the multiplier 610. Therefore, the multiplier 610 may be configured to receive $AC_1$ from the switch 622. When the control signal is 1, the switch 622 may be configured to receive the control signal as 1, and the switch 624 may be configured to receive the inverted control signal as 0. The switch 622 may be configured to output $AC_1$ to the second output, which may not be connected with the multiplier 610. The switch 624 may output $AC_2$ to the first output, which may be connected with the multiplier 610. The multiplier 610 may be configured to receive $AC_2$ from the switch 624.

The control input 604, the inverter 606 and the one or more switches 622-632 may be implemented to perform an interchange operation. The interchange operation may interchange the data signal sent to each of the one or more multipliers 610-620. By performing the interchange operation, each of the one or more multipliers 610-620 may be configured to receive different data signals from different switches of the one or more switches 622-632. The interchange operation may establish different configurations of the SSBM unit 600. The different configurations may include a first configuration and/or a second configuration of the SSBM unit 600. The first configuration may produce less computing error than the second configuration. By selecting the configuration of the SSBM unit 600 with the least computing error, the impact of the output variation is reduced.

Each of the one or more multipliers 610-620 may include a SRAM cell to store one bit of the weight parameter, for example from MSB to LSB, correspondingly. For example, the one or more multipliers 610-620 may be configured to store the 10-bit weight parameter $S_{11}$, such as $[S_{11\_1}, S_{11\_2}, S_{11\_3} \ldots S_{11\_10}]$, from MSB to LSB, correspondingly. Each of the one or more multipliers 610-620 may be associated with a corresponding one bit of the weight parameter. In one example, the multiplier 610 may store the MSB, such as $S_{11\_1}$. The multiplier 610 may be associated with a corresponding one bit of the weight parameter, such as $S_{11\_1}$. In another example, the multiplier 612 may be configured to store the second MSB, such as $S_{11\_2}$. The multiplier 612 may be associated with a corresponding one bit of the weight parameter, such as $S_{11\_2}$. The one or more SRAM cells included in the one or more multipliers 610-620 may include the one or more SRAM cells of the one or more SSBM 430-456 described in FIG. 4.

As described above, each of the one or more multipliers 610-620 may be associated with a corresponding one bit of the weight parameter. Each of the one or more multipliers 610-620 may be configured to establish an output signal by multiplying the input signal from one of the one or more switches 622-632 with the corresponding one bit of the weight parameter stored in the SRAM cell. Each of the one or more multipliers 610-620 may be configured to output the output signal to the output bus 652. For example, the multiplier 610 may be configured to receive the current signal $AC_1$ from the switch 622. The multiplier 610 may be configured to store $S_{11\_1}$ in the SRAM cell. The multiplier 610 may be configured to establish the output signal by multiplying $AC_1$ with $S_{11\_1}$. The multiplier 610 may output $AC_1*S_{11\_1}$ to the output bus 652.

The output bus 652 may be a signal bus that can transfer one or more signals at approximately the same time. The output bus 652 may be configured to receive one or more output signals from the one or more multipliers 610-620. The output bus 652 may be configured to transfer the one or more output signals to the output 654. For example, the one or more multipliers 610-620 may be configured to output $[AC_1*S_{11\_1}, AC_1*S_{11\_2}, AC_1*S_{11\_3} AC_1*S_{11\_10}]$ to the output bus 652. The output bus 652 may be configured to transfer $[AC_1*S_{11\_1}, AC_1*S_{11\_2}, AC_1*S_{11\_3} \ldots AC_1*S_{11\_10}]$ at approximately the same time to the output 654.

The output 654 may be configured to output the one or more output signals from the output bus 652 to one of the one or more output buses 480-482 as illustrated in FIG. 4. The ground terminal 660 may be connected to the one or more transconductors 640-650. The ground terminal 660 may be configured to provide the ground connection to the one or more transconductors 640-650.

The one or more weight parameters stored in the one or more SSBM 430-456 may be configured by the calibration module 408 in the first process. As one of the one or more weight parameter being configured with different values, the one or more digital output signals from the one or more switches 466-470 may change accordingly. The calibration module 408 may be configured to configure the value of the one or more weight parameter by comparing the digital output signal with the corresponding calibration output signal associated to the calibration input signal in the first process.

The calibration output signal may be programmable as desired. The one or more weight parameters stored in the one or more SSBM 430-456 may be programmable to be associated with one or more corresponding calibration output signals as desired. The schematic diagrams associated with FIG. 4-6 may be programmable to establish one or more desired output signals. In one example, the calibration input signal from the calibration module 408 may be $CI_1$, and the corresponding calibration output signal may be $CO_1$. The one or more weight parameters stored in the one or more SSBM 430-456 may be configured to be associated with the calibration output signal $CO_1$. In another example, the calibration input signal from the calibration module 408 may be $CI_1$, and the corresponding calibration output signal may be $CO_2$. The one or more weight parameters stored in the one or more SSBM 430-456 may be configured to be associated with the calibration output signal $CO_2$.

The schematic diagrams associated with FIG. 4-6 may be programmable to output different signals with same input signal. For example, the input signal $X_1$ may be an image, and the input signal $X_1$ may be sent to the schematic diagrams associated with FIG. 4-6. In a first embodiment, the one or more weight parameters stored in the one or more SSBM 430-456 can be programed to allow the schematic diagrams associated with FIG. 4-6 to output a first code corresponding to the content of the image. In a second embodiment, the one or more weight parameters stored in the one or more SSBM 430-456 can be programed to allow the schematic diagrams associated with FIG. 4-6 to output a second code corresponding to the content of the image. The first code and the second code may be different representations to the content of the image. A desired representation may be chosen by configuring the one or more weight parameters to the corresponding values.

Figure 7:
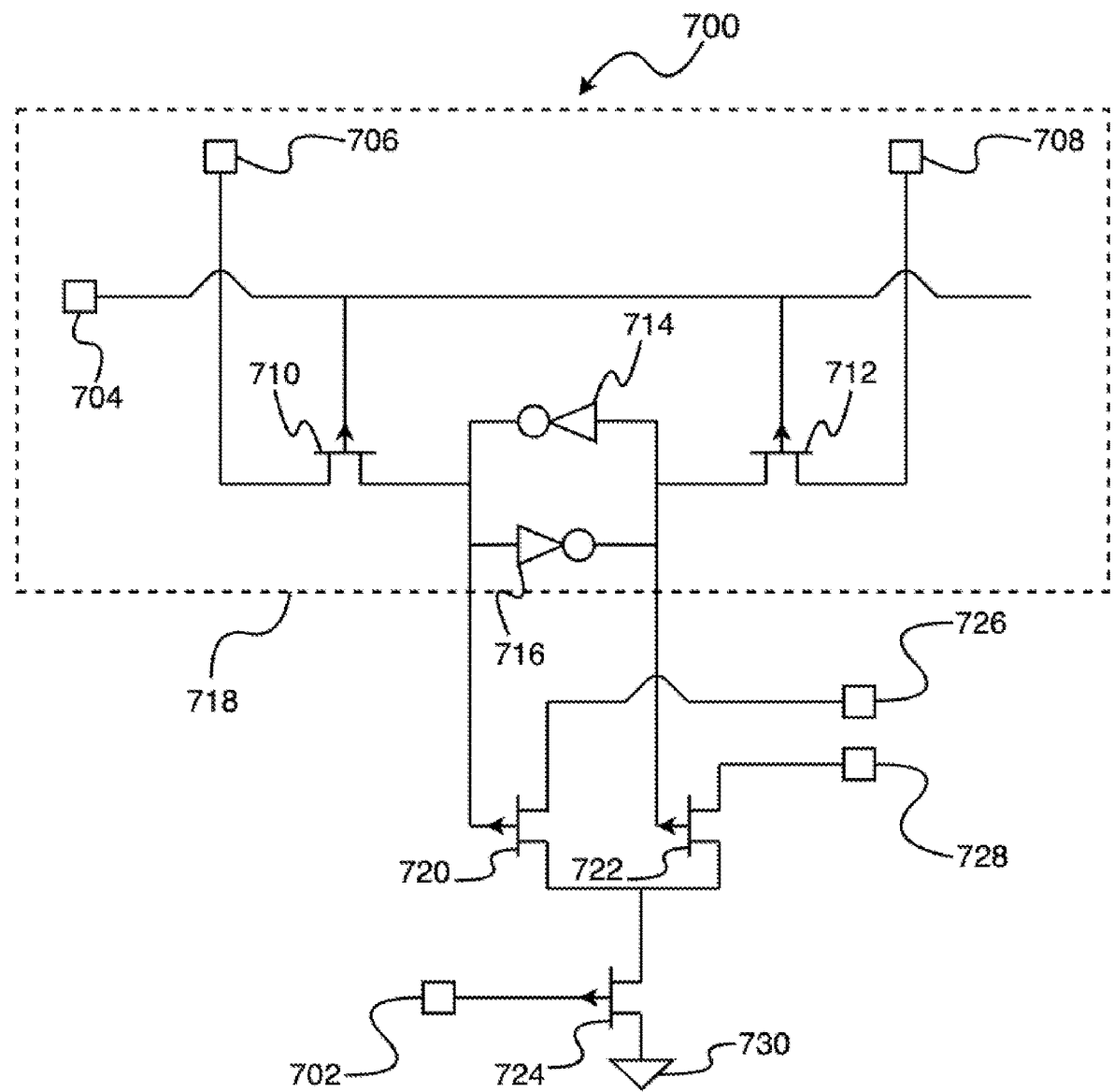
FIG. 7 illustrates an exemplary schematic diagram associated with FIG. 5A in accordance with a first embodiment described herein.

FIG. 7 illustrates an exemplary schematic diagram associated with FIG. 5A in accordance with a first embodiment described herein. A multiplier 700 illustrated in FIG. 7, includes an input 702, a control input 704, a first data input 706, a second data input 708, a first transistor 710, a second transistor 712, a first inverter 714, a second inverter 716, a SRAM cell 718, a third transistor 720, a fourth transistor 722, a fifth transistor 724, a first output 726, a second output 728 and a ground terminal 730.

The multiplier 700 may include the one or more multipliers 512-518 described in FIG. 5A, the one or more multipliers 572-578 described in FIG. 5B, and/or the one or more multipliers 610-620 described in FIG. 6.

The input 702 may be configured to receive an input signal and send the input signal to the fifth transistor 724. The input signal may include a current signal. The control input 704 may be configured to receive a control signal and send the control signal to the first transistor 710 and the second transistor 712. The first data input 706 may be configured to receive a first data signal and send the first data signal to the first transistor 710. The second data input 708 may be configured to receive a second data signal and send the second data signal to the second transistor 712. In one embodiment, the first data signal from the first data input 706 may be an inverse signal of the second data signal from the second data input 708 to improve noise margins. The control input 704, the first data input 706 and the second data input 708 may be included in the code bus 486 described in FIG. 4.

The first transistor 710 may include a first MOSFET. The second transistor 712 may include a second MOSFET. The control signal from the control input 704 may be sent to the input of the first transistor 710, such as the gate of the first MOSFET. The control signal from the control input 704 may be sent to the input of the second transistor 712, such as the gate of the second MOSFET. The first data signal from the first data input 706 may be sent to the source of the first MOSFET. The second data signal from the second data input 708 may be sent to the source of the second MOSFET. The control signal from the control input 704 may be configured to control the first transistor 710 and the second transistor 712. The first transistor 710 may be configured to output the first data signal. The second transistor 712 may be configured to output the second data signal. The first data signal may be sent to the input of the second inverter 716 and/or the third transistor 720, and the second data signal may be sent to the input of the first inverter 714 and/or the fourth transistor 722.

The first inverter 714 and the second inverter 716 may be cross-coupled. In one embodiment, the input of the first inverter 714 may be connected to the output of the second inverter 716, the output of the first inverter 714 may be connected to the input of the second inverter 716.

The first inverter 714 may be configured to receive the second data signal from the second transistor 712. An inverted second data signal may be sent to the input of the second inverter 716. The second inverter 716 may be configured to receive the inverted second data signal from the first inverter 714. The second inverter 716 may be configured to invert the inverted second data signal. The second data signal may be outputted by the second inverter 716. The second data signal from the second inverter 716 may be sent to the input of the first inverter 714. When power is supplied to the first inverter 714 and the second inverter 716, the second data signal sent to the input of the first inverter 714 may be stored.

The second inverter 716 may be configured to receive the first data signal from the first transistor 710. An inverted first data signal may be sent to the input of the first inverter 714. The first inverter 714 may be configured to receive the inverted first data signal from the second inverter 716. The first inverter 714 may invert the inverted first data signal. The first data signal may be outputted by the first inverter 714. The first data signal from the first inverter 714 may be sent to the input of the second inverter 716. When power is supplied to the first inverter 714 and the second inverter 716, the first data signal sent to the input of the second inverter 716 is stored.

The SRAM cell 718 may include the control input 704, the first data input 706, the second data input 708, the first transistor 710, the second transistor 712, the first inverter 714 and the second inverter 716. The SRAM cell 718 may include one of the one or more SRAM cells of the one or more SSBM 430-456 described in FIG. 4. When power is supplied to the SRAM cell 718, the first data signal and the second data signal sent to the SRAM cell 718 are stored.

When the first transistor 710 and/or the second transistor 712 are turned on by the control signal from the control input 704, a new first data signal and/or a new second data signal can over write the SRAM cell 718. The new first data signal and/or the new second data signal may be stored in the SRAM 718.

The third transistor 720 may include a third MOSFET. The first data signal from the first data input 706 may be sent to the input of the third transistor 720, such as the gate of the third MOSFET. The fourth transistor 722 may include a fourth MOSFET. The second data signal from the second data input 708 may be sent to the input of the fourth transistor 722, such as the gate of the fourth MOSFET. Thus, the third transistor 720 may be controlled by the first data signal, the fourth transistor 722 may be controlled by the second data signal. The output of the third transistor 720, such as the drain of the third MOSFET, may be connected to the first output 726. The output of the fourth transistor 722, such as the drain of the fourth MOSFET, may be connected to the second output 728.

The fifth transistor 724 may include a fifth MOSFET. The input signal from the input 702 may be sent to the input of the fifth transistor 724, such as the gate of the fifth MOSFET. The output of the fifth transistor 724, such as the drain of the fifth MOSFET, may be connected to the source of the third MOSFET and/or the source of the fourth MOSFET. The ground terminal 730 may be connected to the source of the fifth MOSFET. The signal outputted from the fifth transistor 724 may be associated to the input signal received at the gate of the fifth MOSFET.

The output of the third transistor 720 may be associated with both the input signal from the input 702 and the first data signal from the first data input 706. For example, the output of the third transistor 720 may be a multiplication product of the input signal from the input 702 and the first data signal from the first data input 706. The output of the fourth transistor 722 may be associated with both the input signal from the input 702 and the second data signal from the second data input 708. For example, the output of the fourth transistor 722 may be a multiplication product of the input signal from the input 702 and the second data signal from the second data input 708.

The first output 726 may be configured to output the signal outputted from the third transistor 720. The second output 728 may be configured to output the signal outputted from the fifth transistor 720. The first output 726 and the second output 728 may be configured as the outputs of the multiplier 700. The first output 726 may be configured to output the signal outputted from the third transistor 720. The second output 728 may be configured to output the signal outputted from the fourth transistor 722. As the first data signal may be the inverse of the second data signal, the output of the third transistor 720 may be the inverse of the output of the fourth transistor 722.

In one embodiment, the input signal received at the input 702 may include the output signal from one of the one or more transconductors 504-510. In one embodiment, the SRAM cell 718 may be configured to store the corresponding one bit of the weight parameter, described in FIG. 5A. In one embodiment, the output of the multiplier 700 may include the multiplication of the output of one of the one or more transconductors 504-510 and the one bit of the weight parameter, and the inverse of the multiplication of the output of one of the one or more transconductors 504-510 and the one bit of the weight parameter. For example, the input 702 may be configured to receive the input signal $AC_1$ from one of the one or more transconductors 504-510 as described in FIG. 5A. the SRMA cell 718 may store the MSB of the weight parameter, such as $S_{11\_1}$. Thus, the output of the multiplier 700 may include $AC_1*S_{11\_1}$ and the inverse of $AC_1*S_{11\_1}$.

Figure 8:
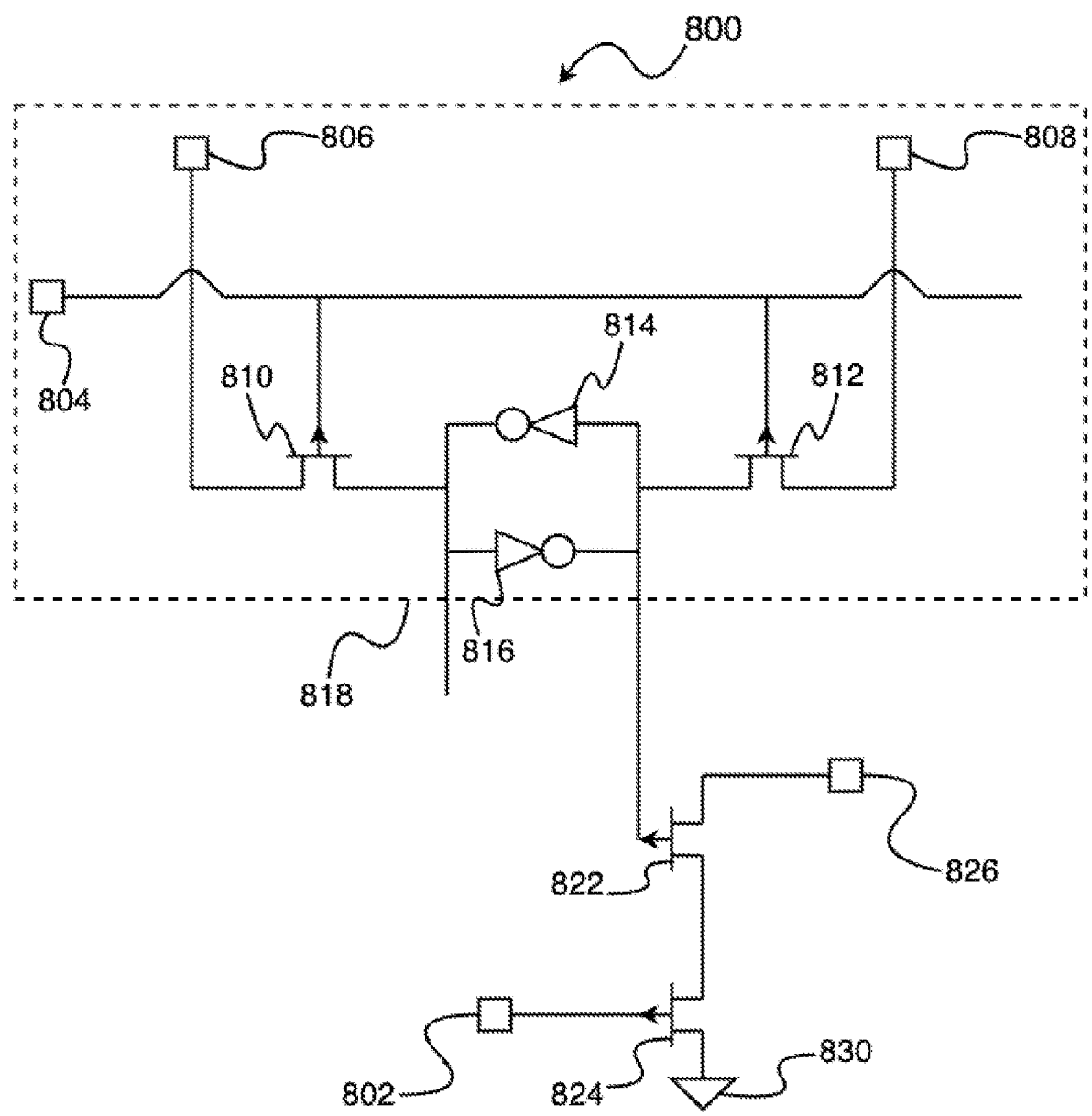
FIG. 8 illustrates an exemplary schematic diagram associated with FIG. 5A in accordance with a second embodiment described herein.

FIG. 8 illustrates an exemplary schematic diagram associated with FIG. 5A in accordance with a second embodiment described herein. A multiplier 800 illustrated in FIG. 8, includes an input 802, a control input 804, a first data input 806, a second data input 808, a first transistor 810, a second transistor 812, a first inverter 814, a second inverter 816, a SRAM cell 818, a third transistor 822, a fourth transistor 824, an output 826 and a ground terminal 830.

The multiplier 800 may include the one or more multipliers 512-518 described in FIG. 5A, the one or more multipliers 572-578 described in FIG. 5B, and/or the one or more multipliers 610-620 described in FIG. 6.

The input 802 may be configured to receive an input signal and send the input signal to the fourth transistor 824. The input signal may include a current signal. The control input 804 may be configured to receive a control signal and send the control signal to the first transistor 810 and the second transistor 812. The first data input 806 may be configured to receive a first data signal and send the first data signal to the first transistor 810. The second data input 808 may be configured to receive a second data signal and send the second data signal to the second transistor 812. In one embodiment the first data signal from the first data input 806 may be the inverse of the second data signal from the second data input 808 to improve the noise margins. The control input 804, the first data input 806 and the second data input 808 may be included in the code bus 486 described in FIG. 4.

The first transistor 810 may include a first MOSFET. The second transistor 812 may include a second MOSFET. The control signal from the control input 804 may be sent to the input of the first transistor 810, such as the gate of the first MOSFET. The control signal from the control input 804 may be sent to the input of the second transistor 812, such as the gate of the second MOSFET. The first data signal from the first data input 806 may be sent to the source of the first MOSFET. The second data signal from the second data input 808 may be sent to the source of the second MOSFET. The control signal from the control input 804 may be configured to control the first transistor 810 and the second transistor 812. The first transistor 810 may be configured to output the first data signal. The second transistor 812 may be configured to output the second data signal. The first data signal may be sent to the input of the second inverter 16, and the second data signal may be sent to the input of the first inverter 814 and/or the third transistor 822.

The first inverter 814 and the second inverter 816 may be cross-coupled. In one embodiment, the input of the first inverter 814 may be connected to the output of the second inverter 816, the output of the first inverter 814 may be connected to the input of the second inverter 816.

The first inverter 814 may be configured to receive the second data signal from the second transistor 812. An inverted second data signal may be sent to the input of the second inverter 816. The second inverter 816 may be configured to receive the inverted second data signal from the first inverter 814. The second inverter 816 may be configured to invert the inverted second data signal. The second data signal may be outputted by the second inverter 816. The second data signal from the second inverter 816 may be sent to the input of the first inverter 814. When power is supplied to the first inverter 814 and the second inverter 816, the second data signal sent to the input of the first inverter 814 is stored.

The second inverter 816 may be configured to receive the first data signal from the first transistor 810. An inverted first data signal may be sent to the input of the first inverter 814. The first inverter 814 may be configured to receive the inverted first data signal from the second inverter 816. The first inverter 814 may be configured to invert the inverted first data signal. The first data signal may be outputted by the first inverter 814. The first data signal from the first inverter 814 may be sent to the input of the second inverter 816. When power is supplied to the first inverter 814 and the second inverter 816, the first data signal sent to the input of the second inverter 816 is stored.

The SRAM cell 818 may include the control input 804, the first data input 806, the second data input 808, the first transistor 810, the second transistor 812, the first inverter 814 and the second inverter 816. The SRAM cell 818 may include one of the one or more SRAM cells of the one or more SSBM 430-456 described in FIG. 4. When power is supplied to the SRAM cell 818, the first data signal and the second data signal sent to the SRAM cell 818 are stored. When the control signal from the control input 804 turns on the first transistor 810 and/or the second transistor 812, a new first data signal and/or a new second data signal can over write the SRAM cell 818. The new first data signal and/or the new second data signal may be stored in the SRAM 818.

The third transistor 822 may include a third MOSFET. The second data signal from the second data input 808 may be sent to the input of the third transistor 822, such as the gate of the third MOSFET. Thus, the third transistor 822 may be controlled by the second data signal. The output of the third transistor 822, such as the drain of the third MOSFET, may be connected to the output 826. The output 826 may be configured to output the signal outputted from the third transistor 822. The output 826 may be configured as the output of the multiplier 800.

The fourth transistor 824 may include a fifth MOSFET. The input signal from the input 802 may be sent to the input of the fourth transistor 824, such as the gate of the fourth MOSFET. The output of the fourth transistor 824, such as the drain of the fourth MOSFET, may be connected to the source of the third MOSFET. The ground terminal 830 may be connected to the source of the fourth MOSFET. The signal outputted from the fourth transistor 824 may be associated to the input signal received at the gate of the fourth MOSFET.

The output signal of the third transistor 822 may be the multiplication of the signal received at the gate of the third MOSFET and the signal received at the source of the third MOSFET. Therefore, the output of the third transistor 822 may be associated with both the input signal from the input 802 and the second data signal from the second data input 808. For example, the output of the third transistor 822 may be multiplication of the input signal from the input 802 and the second data signal from the second data input 808.

In one embodiment, the input signal received at the input 802 may include the output signal from one of the one or more transconductors 504-510. In one embodiment, the SRAM cell 818 may store the corresponding one bit of the weight parameter, described in FIG. 5A. In one embodiment, the output of the multiplier 800 may include the multiplication of the output of one of the one or more transconductors 504-510 and the corresponding one bit of the weight parameter. For example, the input 802 may be configured to receive the input signal $AC_1$ from one of the one or more transconductors 504-510 as described in FIG. 5A. the SRMA cell 818 may store the MSB of the weight parameter, such as $S_{11\_1}$. The output of the multiplier 800 may include $AC_1*S_{11\_1}$.

Figure 9A:
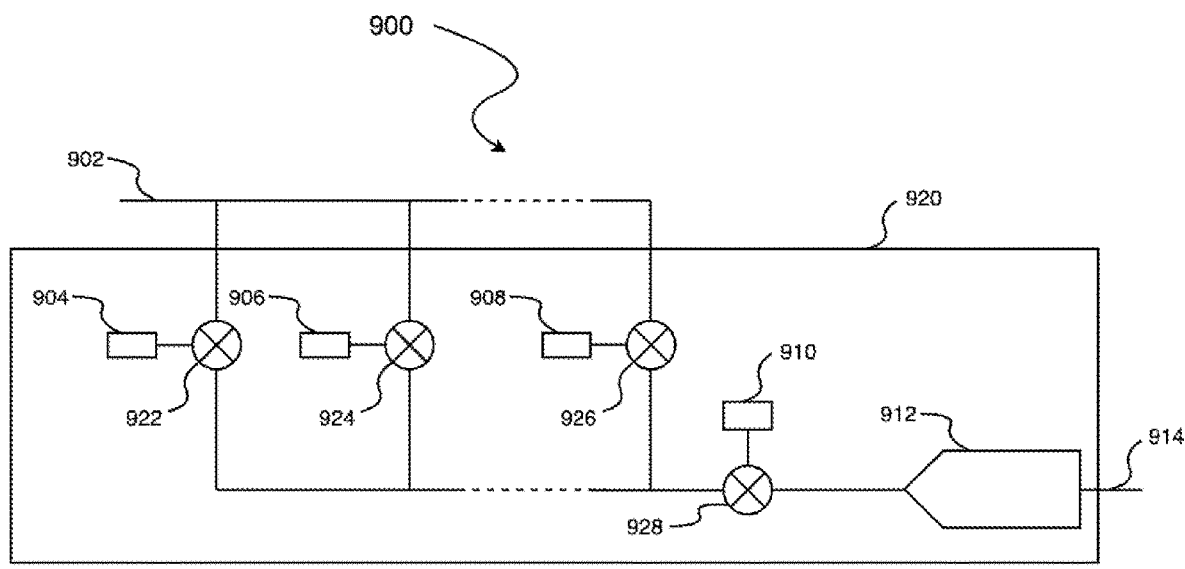
FIG. 9A illustrates an exemplary schematic diagram associated with FIG. 4 in accordance with a first embodiment described herein.

FIG. 9A illustrates an exemplary schematic diagram associated with FIG. 4 in accordance with a first embodiment described herein. A schematic diagram 900 illustrated in FIG. 9A includes an input 902, one or more data inputs 904-910, an analog-to-digital convertor (ADC) 912, an output 914, a computing module 920, and one or more multipliers 922-928.

The input 902 may include a signal bus that can transfer one or more signals at approximately the same time. In one embodiment, the input 902 may be connected to the output bus 520 described in FIG. 5A and/or the output bus 580 described in FIG. 5B. In some embodiments, the input 902 may include one of the one or more output buses 480-482 described in FIG. 4. As described above with reference to FIG. 4, each of the one or more output buses 480-482 may be configured to transfer the analog output signals from the one or more SSBM 430-456. When more than one of the one or more SSBM 430-456 are configured to connect to one of the one or more output buses 480-482 at approximately the same time, the analog output signals from the more than one of the one or more SSBM 430-456 may be directly added together. The input 902 may transfer the analog output signals from the one or more SSBM 430-456. For example, the output bus 480 may transfer $[A_1*S_{11\_1}+A_2*S_{21\_1}, A_1*S_{11\_2}+A_2*S_{21\_2}, A_1*S_{11\_3}+A_2*S_{21\_3}, \ldots A_1*S_{11\_10}+A_2*S_{21\_10}]$. The input 902 may transfer the same signal as the output bus 480, such as $[A_1*S_{11\_1}+A_2*S_{21\_1}, A_1*S_{11\_2}+A_2*S_{21\_2}, A_1*S_{11\_3}+A_2*S_{21\_3}, \ldots A_1*S_{11\_10}+A_2*S_{21\_10}]$.

The one or more data inputs 904-908 may be configured to store the one or more weight radixes as described above with reference to FIG. 4. In one embodiment, the one or more weight radixes may be a plurality of radixes (r) to the powers from N−1 to 0, such as $[r^{N-1}, r^{N-2}, \ldots r^2, r^1, r^0]$. The number N may be equal to the number of bits of the weight parameters stored in the one or more SRAM cells of the one or more SSBM 430-456. The one or more weight radixes may be one or more sub-binary radixes, including, for example, the radixes which are equal to 1.5. For example, when N is equal to 10, the data input 904 may be configured to store $r^9$. For another example, when N is equal to 10, the data input 906 may be configured to store $r^8$.

Each of the one or more multipliers 922-926 may be configured to establish an output signal by multiplying the signal from input 902 and the weight radixes stored on the one or more data input. For example, the multiplier 922 may be configured to receive $A_1*S_{11\_1}+A_2*S_{21\_1}$ from input 902, the data input 904 may be configured to store $r^9$, the multiplier 922 may be configured to establish the output signal by multiplying $A_1*S_{11\_1}+A_2*S_{21\_1}$ with $r^9$. The output signal from the multiplier 922 may be $(A_1*S_{11\_1}+A_2*S_{21\_1})*r^9$.

The signal transferred by the input 902 may include one or more analog signals, the one or more output signals from the one or more multipliers 922-926 may include one or more analog signals. When one or more output signals from the one or more multipliers 922-926 are connected together at approximately the same time, the one or more output signals from the one or more multipliers 922-926 may be directly added together. For example, the output signal from the multiplier 922 may be $(A_1*S_{11\_1}+A_2*S_{21\_1})*r^9$, the output signal from the multiplier 924 may be $(A_1*S_{11\_1}+A_2*S_{21\_1})*r^9$. When the output signal of the multiplier 922 and the output signal of the multiplier 924 are connected together, the output signal of the multiplier 922 and the output signal of the multiplier 924 may be directly added together, such as $(A_1*S_{11\_1}+A_2*S_{21\_1})*r^9+(A_1*S_{11\_1}+A_2*S_{21\_1})*r^8$.

When one or more output signals of the one or more multipliers 922-926 are connected together, the one or more output signals of the one or more multipliers 922-926 may be directly added together. The result of the addition of the one or more output signals of the one or more multipliers 922-926 may be out of the input range of the ADC 912. The data input 910 may be configured to store an input data, such as a scale factor, to regulate the result of the addition of the one or more output signals of the one or more multipliers 922-926 to be within the input range of the ADC 912 by using the scale factor. The multiplier 928 may be configured to perform a multiplication operation to the output signals of the one or more multipliers 922-926 with the input data from the data input 910. For example, the result of the addition of the one or more output signals of the one or more multipliers 922-926 may be 100, the input range of the ADC 912 may be 0 to 20. The data input 910 may be configured to store the input data which is equal to 0.1. When the multiplier 928 performs the multiplication operation to 100 with 0.1, the output of the multiplier 928 is 10. The output of the multiplier 928 is within the input range of the ADC 912.

The ADC 912 may be configured to perform one or more analog-to-digital conversions to the output of the multiplier 928. The output of the ADC 912 may be sent to the output 914, as the output of the schematic diagram 900.

The computing module 920 may comprise the one or more data inputs 904-910, the analog-to-digital convertor (ADC) 912, and the one or more multiplier 922-928. The computing module 920 may include one of the one or more analog to digital converters (ADC) 460-464 described in FIG. 4.

Figure 9B:
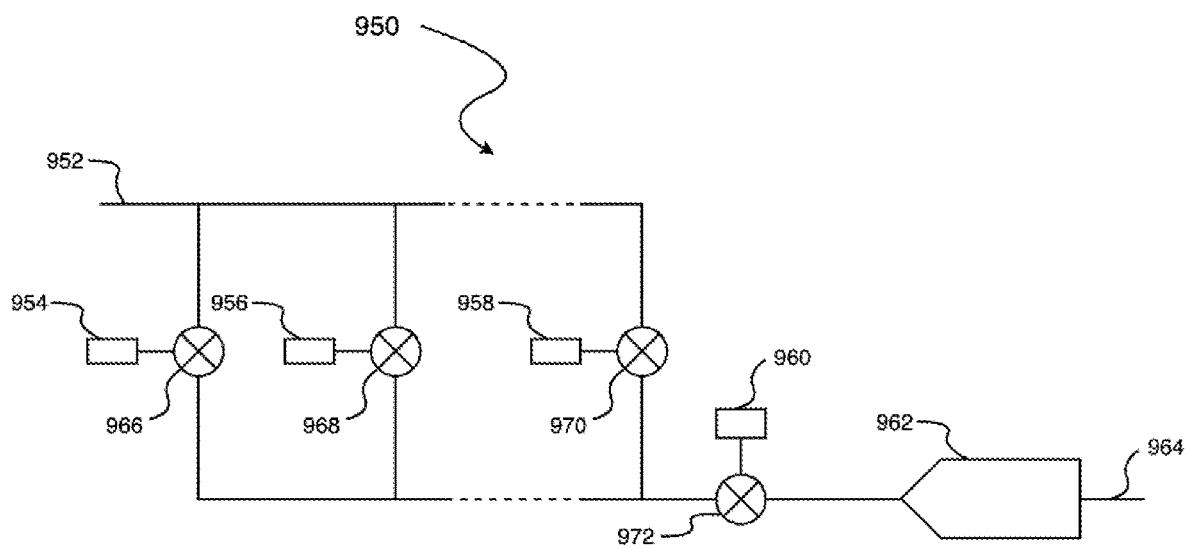
FIG. 9B illustrates an exemplary schematic diagram associated with FIG. 4 in accordance with a second embodiment described herein.

FIG. 9B illustrates an exemplary schematic diagram associated with FIG. 4 in accordance with a second embodiment described herein. A schematic diagram 950 illustrated in FIG. 9B includes an input 952, one or more data inputs 954-960, an analog-to-digital convertor (ADC) 962, an output 964, and one or more multipliers 966-972.

The input 952 may include a signal bus that can transfer one or more signals at approximately the same time. In one embodiment, the input 952 may be connected to the output bus 520 described in FIG. 5A and/or the output bus 580 described in FIG. 5B. In some embodiments, the input 952 may include one of the one or more output buses 480-482 described in FIG. 4. As described above with reference to FIG. 4, each of the one or more output buses 480-482 may be configured to transfer the analog output signals from the one or more SSBM 430-456. When more than one of the one or more SSBM 430-456 are connected to one of the one or more output buses 480-482 at approximately the same time, the analog output signals from the more than one of the one or more SSBM 430-456 may be directly added together. The input 952 may be configured to transfer the analog output signals from the one or more SSBM 430-456. For example, the output bus 480 may transfer $[A_1*S_{11\_1}+A_2*S_{21\_1}, A_1*S_{11\_2}+A_2*S_{21\_2}, A_1*S_{11\_3}+A_2*S_{21\_3}, \ldots A_1*S_{11\_10}+A_2*S_{21\_10}]$. The input 952 may transfer the same signal as the output bus 480, such as $[A_1*S_{11\_1}+A_2*S_{21\_1}, A_1*S_{11\_2}+A_2*S_{21\_2}, A_1*S_{11\_3}+A_2*S_{21\_3}, \ldots A_1*S_{11\_10}+A_2*S_{21\_10}]$.

The one or more data inputs 954-958 may be configured to store the one or more weight radixes as described above with reference to FIG. 4. In one embodiment, the one or more weight radixes may be a plurality of radixes to the powers from N-1 to 0, such as $[r^{N-1}, r^{N-2}, \ldots r_2, r^1, r^0]$. The number N may be equal to the number of bits of the weight parameters stored in the one or more SRAM cells of the one or more SSBM 430-456. The one or more weight radixes r may be one or more sub-binary radixes, including, for example, the radixes which are equal to 1.5. For example, when N is equal to 10, the data input 954 may be configured to store $r^9$. For another example, when N is equal to 10, the data input 956 may be configured to store $r^8$.

Each of the one or more multipliers 966-970 may be configured to establish an output signal by multiplying the signal from input 952 and the weight radixes stored on the one or more data input. For example, the multiplier 966 may be configured to receive $A_1*S_{11\_1}+A_2*S_{21\_1}$ from input 952, the data input 954 may be configured to store $r^9$, the multiplier 966 may be configured to establish the output signal by multiplying $A_1*S_{11\_1}+A_2*S_{21\_1}$ with $r^9$. The output signal from the multiplier 966 may be $(A_1*S_{11\_1}+A_2*S_{21\_1})*r^9$.

The signal transferred by the input 952 may include one or more analog signals, the one or more output signals from the one or more multipliers 966-970 may include one or more analog signals. When one or more output signals from the one or more multipliers 966-970 are connected together at approximately the same time, the one or more output signals from the one or more multipliers 966-970 may be directly added together. For example, the output signal from the multiplier 966 may be $(A_1*S_{11\_1}+A_2*S_{21\_1})*r^9$, the output signal from the multiplier 968 may be $(A_1*S_{11\_1}+A_2*S_{21\_1})*r^8$. When the output signals of the multiplier 966 and the multiplier 968 are connected together, the output signals may be directly added together, such as $(A_1*S_{11\_1}+A_2*S_{21\_1})*r^9+(A_1*S_{11\_1}+A_2*S_{21\_1})*r^8$.

When one or more output signals of the one or more multipliers 966-970 are connected together, the one or more output signals of the one or more multipliers 966-970 may be directly added together. The result of the addition of the one or more output signals of the one or more multipliers 966-970 may be outside of the input range of the ADC 962. The data input 960 may be configured to store an input data, such as a scale factor, to regulate the result of the addition of the one or more output signals of the one or more multipliers 966-970 to be within the input range of the ADC 962, by using the scale factor. The multiplier 972 may be configured to perform a multiplication operation to the output signals of the one or more multipliers 966-970 with the input data from the data input 960. For example, the result of the addition of the one or more output signals of the one or more multipliers 966-970 may be 100, the input range of the ADC 962 may be 0 to 20. The data input 960 may be configured to store the input data which is equal to 0.1. When the multiplier 972 is configured to the multiplication operation to 100 with 0.1, then the output of the multiplier 972 is 10. The output of the multiplier 972 is within the input range of the ADC 962.

The ADC 962 may be configured to perform one or more analog-to-digital conversions to the output of the multiplier 972. The output of the ADC 962 may be sent to the output 964, as the output of the schematic diagram 950.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip. The term code, as used above, may include software, firmware, and/or microcode, and may refer to programs, routines, functions, classes, and/or objects. The term shared processor encompasses a single processor that executes some or all code from multiple modules. The term memory may be a subset of the term computer-readable medium. The term computer-readable medium does not encompass transitory electrical and electromagnetic signals propagating through a medium, and may therefore be considered tangible and non-transitory. Nonlimiting examples of a non-transitory tangible computer read-able medium include nonvolatile memory, volatile memory, magnetic storage, and optical storage.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

What is claimed is:
1. An analog computing system, comprising:
an input node;
a multiplexer (MUX);
a digital to analog converter (DAC);
a SRAM-based Sub-Binary Multiplier (SSBM);
an analog to digital converter (ADC);
a switch;
an output node; and
a calibration module, wherein
the MUX is configured to receive a calibration input signal from the calibration module and send the calibration input signal to the DAC;
the DAC is configured to:
receive the calibration input signal from the MUX,
perform a digital-to-analog conversion to the calibration input signal,
generate a first analog input signal corresponding to the calibration input signal, after the completion of the digital-to-analog conversion, and
send the first analog input signal to the SSBM;
the SSBM is configured to:
store a weight parameter, wherein the weight parameter comprises a plurality of bits,
receive the first analog input signal from the DAC,
generate a plurality of first analog output signals based on the first analog input signal and the weight parameter, and
send the plurality of first analog output signals to the ADC;
the ADC is configured to:
receive the plurality of first analog output signals from the SSBM,
generate a plurality of first weighted analog output signals based on the plurality of first analog output signals and a plurality of sub-binary weight radixes,
generate a first combined analog output signal based on the plurality of first weighted analog output signals,
perform an analog-to-digital conversion to the first combined analog output signal to generate a first digital output signal, and
send the first digital output signal to the switch;
the switch is configured to receive the first digital output signal from ADC, and send the first digital output signal to the calibration module;
the calibration module is configured to:
send the calibration input signal to the MUX,
configure the MUX to send the calibration input signal to the DAC,
configure the switch to send the first digital output signal,
receive the first digital output signal from the switch, and
configure the weight parameter stored in the SSBM based on the first digital output signal from the switch;
the input node is configured to receive an input signal and send the input signal to the MUX;
the MUX is further configured to receive the input signal from the input node and send the input signal to the DAC;
the DAC is further configured to perform the digital-to-analog conversion to the input signal, and send a second analog input signal to the SSBM;
the SSBM is further configured to:
receive the second analog input signal from the DAC,
generate a plurality of second analog output signals based on the second analog input signal and the weight parameter, and
send the plurality of second analog output signals to the ADC;
the ADC is configured to:
receive the plurality of second analog output signals from the SSBM,
generate a plurality of second weighted analog output signals based on the plurality of second analog output signals and the plurality of sub-binary weight radixes;
generate a second combined analog output signal based on the plurality of second weighted analog output signals;

perform the analog-to-digital conversion to the second combined analog output signal to generate a second digital output signal, and send the second digital output signal to the switch;

the switch is further configured to receive the second digital output signal from ADC, and send the second digital output signal to the output node; and the output node is configured to receive the second digital output signal and output the second digital output signal.

2. The system of claim 1, wherein the calibration input signal includes a digital calibration input signal from the calibration module, wherein the input signal includes a digital input signal, and wherein each of the plurality of first analog output signals is generated by multiplying the first analog input signal with each bit of the weight parameter stored in the SSBM.

3. The system of claim 1, wherein the ADC comprises a plurality of multipliers associated with the plurality of sub-binary weight radixes and wherein ADC is configured to generate the plurality of first weighted signals by multiplying the plurality of first analog output signals with the plurality of sub-binary weight radixes.

4. The system of claim 1, wherein the ADC is configured to generate the first combined analog output signal by directly adding each of the plurality of first weighted analog output signals together.

5. The system of claim 1, wherein the calibration module is configured to compare the first digital output signal from the switch with a corresponding calibration output before configuring the weight parameter stored in the SSBM based on the first digital output signal from the switch.

6. The system of claim 1, wherein each of the plurality of second analog output signals is generated by multiplying the second analog input signal with each bit of the weight parameter stored in the SSBM.

7. The system of claim 1, wherein the ADC is configured to generate the plurality of second weighted signals by multiplying the plurality of second analog output signals with the plurality of sub-binary weight radixes.

8. The system of claim 1, wherein the ADC is configured to generate the second combined analog output signal by directly adding each of the plurality of second weighted analog output signals together.

9. The system of claim 1, wherein the SSBM comprises a plurality of SRAM cells to store the plurality of bits of the weight parameter.

10. An analog computing system, comprising:
a multiplexer (MUX);
a digital to analog converter (DAC);
a SRAM-based Sub-Binary Multiplier (SSBM);
an analog to digital converter (ADC);
a switch; and
a calibration module, wherein
the MUX is configured to receive a calibration input signal from the calibration module and send the calibration input signal to the DAC;
the DAC is configured to:
receive the calibration input signal from the MUX,
perform a digital-to-analog conversion to the calibration input signal,
generate an analog input signal corresponding to the calibration input signal, after the completion of the digital-to-analog conversion, and
send the analog input signal to the SSBM;

the SSBM is configured to:
store a weight parameter, wherein the weight parameter comprises a plurality of bits,
receive the analog input signal from the DAC,
generate a plurality of analog output signals based on the analog input signal and the weight parameter, and
send the plurality of analog output signals to the ADC;
the ADC is configured to:
receive the plurality of analog output signals from the SSBM,
generate a plurality of weighted analog output signals based on the plurality of analog output signals and a plurality of sub-binary weight radixes,
generate a combined analog output signal based on the plurality of weighted analog output signals,
perform an analog-to-digital conversion to the combined analog output signal to generate a digital output signal, and
send the digital output signal to the switch;
the switch is configured to receive the digital output signal from ADC, and send the digital output signal to the calibration module;
the calibration module is configured to:
send the calibration input signal to the MUX,
configure the MUX to send the calibration input signal to the DAC,
configure the switch to send the digital output signal,
receive the digital output signal from the, and
configure the weight parameter stored in the SSBM based on the digital output signal from the switch.

11. The system of claim 10, wherein the calibration input signal includes a digital calibration input signal from the calibration module and wherein each of the plurality of analog output signals is generated by multiplying the analog input signal with each bit of the weight parameter stored in the SSBM.

12. The system of claim 10, wherein the ADC comprises a plurality of multipliers associated with the plurality of sub-binary weight radixes and wherein the ADC is configured to generate the plurality of weighted signals by multiplying the plurality of analog output signals with the plurality of sub-binary weight radixes.

13. The system of claim 10, wherein the ADC is configured to generate the combined analog output signal by directly adding each of the plurality of weighted analog output signals together.

14. The system of claim 10, wherein the calibration module is configured to compare the digital output signal from the switch with a corresponding calibration output before configuring the weight parameter stored in the SSBM based on the digital output signal from the switch.

15. The system of claim 10, wherein the SSBM comprises a plurality of SRAM cells to store the plurality of bits of the weight parameter.

16. An analog computing system, comprising:
an input node;
a multiplexer (MUX);
a digital to analog converter (DAC);
a SRAM-based Sub-Binary Multiplier (SSBM);
an analog to digital converter (ADC);
a switch; and
an output node; wherein
the input node is configured to receive an input signal and send the input signal to the MUX;
the MUX is configured to receive the input signal from the input node and send the input signal to the DAC;

the DAC is configured to perform the digital-to-analog conversion to the input signal, and send an analog input signal to the SSBM;

the SSBM is configured to:
  store a weight parameter, wherein the weight parameter comprises a plurality of bits,
  generate a plurality of analog output signals based on the analog input signal and the weight parameter, and
  send the plurality of analog output signals to the ADC;

the ADC is configured to:
  receive the plurality of analog output signals from the SSBM,
  generate a plurality of weighted analog output signals based on the plurality of analog output signals and a plurality of sub-binary weight radixes,
  generate a combined analog output signal based on the plurality of weighted analog output signals, and
  perform the analog-to-digital conversion to the combined analog output signal to generate a digital output signal, and;
  send the digital output signal to the switch;

the switch is configured to receive the digital output signal from ADC, and send the digital output signal to the output node; and the output node is configured to receive the digital output signal.

17. The system of claim 16, wherein the input signal includes a digital input signal and wherein each of the plurality of analog output signals is generated by multiplying the analog input signal with each bit of the weight parameter stored in the SSBM.

18. The system of claim 16, wherein the ADC comprises a plurality of multipliers associated with the plurality of sub-binary weight radixes and wherein the ADC is configured to generate the plurality of weighted signals by multiplying the plurality of analog output signals with the plurality of sub-binary weight radixes.

19. The system of claim 16, wherein the ADC is configured to generate the combined analog output signal by directly adding each of the plurality of weighted analog output signals together.

20. The system of claim 16, wherein the SSBM comprises a plurality of SRAM cells to store the plurality of bits of the weight parameter.

* * * * *